US011682881B2

(12) United States Patent
Shahin et al.

(10) Patent No.: US 11,682,881 B2
(45) Date of Patent: Jun. 20, 2023

(54) BROADENED SPECTRUM LASER DIODE FOR DISPLAY DEVICE

(71) Applicant: Microsoft Technology Licensing, LLC, Redmond, WA (US)

(72) Inventors: Shiva Shahin, Seattle, WA (US); Dale Eugene Zimmerman, Redmond, WA (US)

(73) Assignee: Microsoft Technology Licensing, LLC, Redmond, WA (US)

( * ) Notice: Subject to any disclaimer, the term of this patent is extended or adjusted under 35 U.S.C. 154(b) by 465 days.

(21) Appl. No.: 16/886,472

(22) Filed: May 28, 2020

(65) Prior Publication Data

US 2021/0281043 A1   Sep. 9, 2021

Related U.S. Application Data

(60) Provisional application No. 62/987,110, filed on Mar. 9, 2020.

(51) Int. Cl.
*H01S 5/10* (2021.01)
*H01S 5/062* (2006.01)
(Continued)

(52) U.S. Cl.
CPC ........ *H01S 5/1096* (2013.01); *G02B 26/0833* (2013.01); *G02B 26/10* (2013.01); *G02B 27/0172* (2013.01); *H01S 5/026* (2013.01); *H01S 5/0265* (2013.01); *H01S 5/0601* (2013.01); *H01S 5/062* (2013.01); *H01S 5/1053* (2013.01); *H01S 5/125* (2013.01); *H01S 5/3403* (2013.01); *H01S 5/3413* (2013.01); *H01S 5/34326* (2013.01); *H01S 5/34333* (2013.01); *H01S 5/4031* (2013.01); *H01S 5/4037* (2013.01); *H01S 5/4087* (2013.01);
(Continued)

(58) Field of Classification Search
CPC .................................................... H01S 5/1096
USPC ......................................................... 359/291.2
See application file for complete search history.

(56) References Cited

U.S. PATENT DOCUMENTS 4,747,110 A   5/1988   Takahashi et al.
5,384,797 A   1/1995   Welch et al.
(Continued)

FOREIGN PATENT DOCUMENTS

EP   1710876 A1   10/2006
JP   H02015687 A   1/1990

OTHER PUBLICATIONS

"Applicant Initiated Interview Summary Issued in U.S. Appl. No. 16/886,530", dated Mar. 18, 2022, 4 Pages.
(Continued)

*Primary Examiner* — Tuan N Nguyen
(74) *Attorney, Agent, or Firm* — Alleman Hall Creasman & Tuttle LLP

(57) ABSTRACT

A broad-spectrum laser for use in a MEMS laser scanning display device is provided. In one example, the broad-spectrum laser includes a laser diode emitter with plural quantum wells each having a different spectral peak. In another example, the broad-spectrum laser includes a laser diode emitter with a tunable absorber to achieve a broadened emissions spectrum. In another example, the broad-spectrum laser includes a laser diode emitter array having plural individual emitters with different spectral peaks.

10 Claims, 23 Drawing Sheets

(51) Int. Cl.

| | |
|---|---|
| *H01S 5/34* | (2006.01) |
| *H01S 5/026* | (2006.01) |
| *H01S 5/06* | (2006.01) |
| *G02B 26/08* | (2006.01) |
| *G02B 26/10* | (2006.01) |
| *G02B 27/01* | (2006.01) |
| *H01S 5/125* | (2006.01) |
| *H01S 5/343* | (2006.01) |
| *H01S 5/40* | (2006.01) |
| *H01S 5/0625* | (2006.01) |

(52) U.S. Cl.
CPC .... *G02B 2027/0178* (2013.01); *H01S 5/0625* (2013.01); *H01S 5/4093* (2013.01)

(56) References Cited

U.S. PATENT DOCUMENTS

| | | | |
|---|---|---|---|
| 5,396,508 | A | 3/1995 | Bour et al. |
| 6,027,989 | A | 2/2000 | Poole et al. |
| 2002/0003918 | A1 | 1/2002 | Ooi et al. |
| 2007/0152225 | A1 | 7/2007 | Ooi et al. |
| 2011/0013245 | A1 | 1/2011 | Tanaka et al. |
| 2011/0317130 | A1* | 12/2011 | Gollier ............... H04N 9/3129 353/34 |
| 2019/0372306 | A1 | 12/2019 | Reidy et al. |
| 2020/0244045 | A1 | 7/2020 | Bismuto et al. |
| 2021/0281047 | A1 | 9/2021 | Shahin et al. |

OTHER PUBLICATIONS

Kafar, et al., "Nitride Superluminescent Diodes with Broadened Emission Spectrum Fabricated using Laterally Patterned Substrate", In Journal of Optics express, vol. 24, Issue 9, May 2, 2016, pp. 9673-9682.

"Application as Filed in U.S. Appl. No. 16/413,505", dated May 15, 2019, 31 Pages.

Al-Jabr, et al., "Large Bandgap Blueshifts in the InGaP/InAlGaP Laser Structure Using Novel Strain-Induced Quantum Well Intermixing", In Journal of Applied Physics, vol. 119, Issue 13, Apr. 7, 2016, 7 Pages.

"International Search Report and the Written Opinion Issued in PCT Application No. PCT/US2021/014048", dated May 19, 2021, 12 Pages.

"International Search Repod and Written Opinion Issued in PCT Application No. PCT/US21/015138", dated Jul. 5, 2021, 19 Pages.

"Invitation to Pay Additional Fees Issued in PCT Application No. PCT/US21/015138", dated May 14, 2021, 13 Pages.

"Non Final Office Action Issued in U.S. Appl. No. 16/886,530", dated Dec. 22, 2021, 14 Pages.

"Final Office Action Issued in U.S. Appl. No. 16/886,530", dated Jul. 5, 2022, 14 Pages.

Teng, et al., "Multi-wavelength lasers fabricated by a novel impurity-free quantum well intermixing technology", In Proceedings of the International Society for Optical Engineering, vol. 3896, Nov. 12, 1999, pp. 191-198.

"Non Final Office Action Issued in U.S. Appl. No. 16/886,530", dated Nov. 9, 2022, 12 Pages.

* cited by examiner

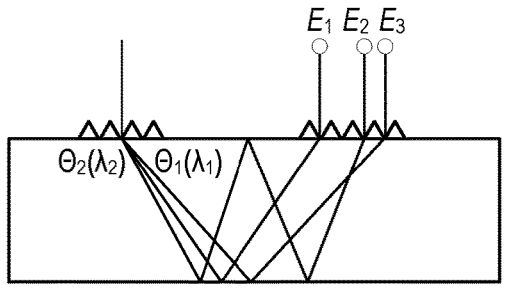
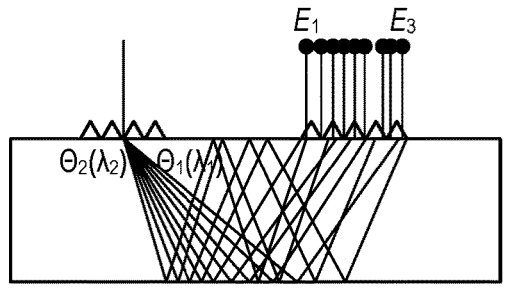
FIG. 5A
FIG. 5B
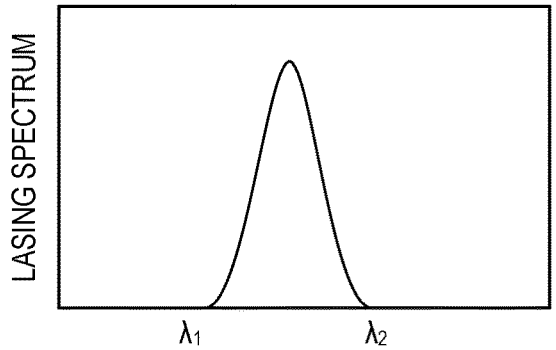
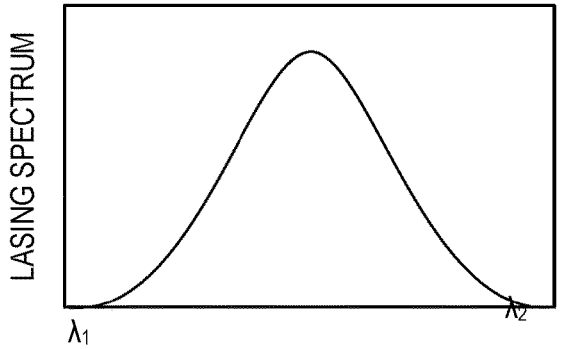
FIG. 5C
FIG. 5D
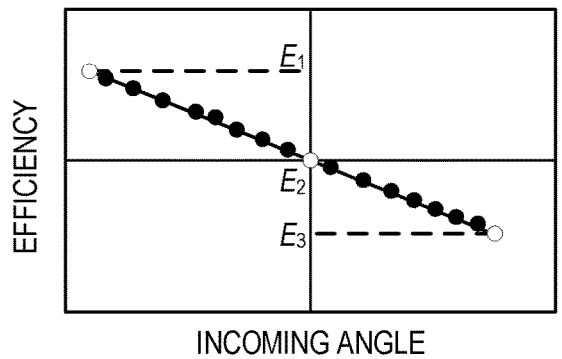
FIG. 5E

```
                                             ← 2300
┌─────────────────────────────────────────────────────┐
│ SUPPLYING, VIA A FIRST CURRENT OR VOLTAGE SOURCE,   │ ─ 2302
│ A FIRST DRIVE CURRENT OR VOLTAGE TO A GAIN SECTION  │
│ COUPLED WITH THE FIRST CURRENT OR VOLTAGE SOURCE    │
└─────────────────────────────────────────────────────┘
                          │
                          ▼
┌─────────────────────────────────────────────────────┐
│ SUPPLYING, VIA A SECOND CURRENT OR VOLTAGE SOURCE,  │ ─ 2304
│ A SECOND DRIVE CURRENT OR VOLTAGE TO A TUNABLE      │
│ ABSORBER SECTION COUPLED WITH THE SECOND CURRENT    │
│ OR VOLTAGE SOURCE, WHEREIN THE GAIN SECTION AND THE │
│ TUNABLE ABSORBER SECTION ARE INCLUDED IN A LASER    │
│ DIODE FOR USER IN A MICRO ELECTRO-MECHANICAL SYSTEM │
│ (MEMS) LASER SCANNING DISPLAY DEVICE                │
└─────────────────────────────────────────────────────┘
                          │
                          ▼
┌─────────────────────────────────────────────────────┐
│ MODULATING THE SECOND DRIVE CURRENT OR VOLTAGE TO   │
│ SWEEP THROUGH A RANGE OF VALUES OVER A PERIOD OF    │
│ TIME TO CAUSE A SHIFTING OF A WAVELENGTH OF THE     │ ─ 2306
│ LASER DIODE AT WHICH AN OVERALL GAIN IS AT MAXIMUM, │
│ TO THEREBY CAUSE THE LASER DIODE TO EMIT            │
│ SPECTRALLY BROADENED LIGHT                          │
└─────────────────────────────────────────────────────┘
```

FIG. 23

BROADENED SPECTRUM LASER DIODE FOR DISPLAY DEVICE

CROSS REFERENCE TO RELATED APPLICATIONS

This application claims priority to U.S. Provisional Patent Application Ser. No. 62/987,110, filed Mar. 9, 2020, the entirety of which is hereby incorporated herein by reference for all purposes.

BACKGROUND

Laser scanning micro-electro-mechanical systems (MEMS) based displays have several advantages over liquid crystal displays (LCDs) and liquid crystal on silicon (LCOS) displays. Such advantages include smaller size, lighter weight, lower power consumption, and higher brightness and contrast. In a waveguide-based laser scanning display, image light beams emitted from the laser are coupled into one or more waveguides. These light beams propagate through the waveguide(s), while being replicated, and then are coupled out of the waveguide(s) into a user's eyes.

SUMMARY

A laser diode emitter for use in a MEMS laser scanning display device is provided. The laser diode emitter may comprise a gain section coupled with a first current or voltage source, and a tunable absorber section coupled with a second current or voltage source. The second current or voltage source may be configured to supply a drive current or voltage that sweeps through a range of values over a period of time to cause a shifting of a wavelength of the laser diode emitter at which an overall gain is at maximum, to thereby cause the laser diode emitter to emit spectrally broadened light.

Additionally, a MEMS laser scanning display device is also provided. The MEMS laser scanning display may comprise a display, a laser light source, and a MEMS scanning mirror. The laser light source may include an emitter array including a plurality of laser diode emitters. Each laser diode emitter may be configured to emit a respective different wavelength of light, to thereby form a broadband light beam with a broadband emission spectrum. The broadband light beam may have an emission spectrum that includes a plurality of peaks. The MEMS scanning mirror may be configured to guide the light beam, via a wave guide with an in-coupling grating and out-coupling grating, to achieve a scanning pattern across the display and thereby form a displayed image.

Additionally, a laser diode emitter is provided. The laser diode emitter may comprise a substrate, and a plurality of quantum wells formed on the substrate. Each of the quantum wells may have a respective composition to achieve a respective peak wavelength in emitted light when energized, each respective peak wavelength being different. When the laser diode emitter is energized, the plurality of quantum wells may collectively lase emitted light having a broader bandwidth than is emitted by any individual quantum well of the plurality of quantum wells. The emitted light may have a plurality of respective peak wavelengths across an emitted light frequency spectrum.

This Summary is provided to introduce a selection of concepts in a simplified form that are further described below in the Detailed Description. This Summary is not intended to identify key features or essential features of the claimed subject matter, nor is it intended to be used to limit the scope of the claimed subject matter. Furthermore, the claimed subject matter is not limited to implementations that solve any or all disadvantages noted in any part of this disclosure.

BRIEF DESCRIPTION OF THE DRAWINGS

FIGS. 5A-5E illustrate the relationship between the breadth of the incoming light spectrum and the efficiency and angles of light transmission through in-coupling and out-coupling gratings of a waveguide, which in turn can affect the color uniformity and spatial overlap of the emitted light in a configuration such as that of FIG. 2.

FIG. 23 illustrates a flowchart of a method, according to another embodiment of the present disclosure.

DETAILED DESCRIPTION

Compared to other types of light sources such as light emitting diodes (LEDs) that work based on a light emission process such as spontaneous emission, lasers produce light through stimulated emission. Typically, the stimulated emission of lasers creates photons of identical phase, frequency, and direction of travel in a cavity of the laser device, the photons being at a wavelength with gain near a maximum. Thus, the stimulated emission process typically results in a narrower spectral bandwidth in lasers compared to other types of light sources such as LEDs.

The narrower spectra in lasers may potentially cause several challenges in display applications. For example, the narrower spectra may potentially cause high contrast fringe artifacts in waveguide-based displays. In a waveguide-based laser scanning display, there are myriad (e.g., millions of) light paths resulting from multiple interactions of image light beams propagating through a waveguide and grating structures (e.g., surface relief grating SRG). As such, there are myriad possible interactions between light beams with different optical path lengths (OPLs). It will be appreciated that a laser is a coherent light source where certain OPLs that are proportional to an optical cavity length of the laser form temporal coherence peaks. If an OPL of the waveguide matches any of the coherence OPLs of the laser, an interference fringe may be formed. An interference fringe may create an artifact in an image presented by the waveguide-based laser scanning display. Such an artifact may degrade the perceived image quality of the waveguide-based laser scanning display.

Another potential image artifact that may occur due to the narrower spectra of lasers is color nonuniformity. Due to the typically small bandwidths of lasers and the dispersive nature of surface relief gratings (SRGs), the incoming light couples inside the waveguides only at a small range of angles (diffraction's dependence on wavelength: $\theta(\lambda)$). Considering that the SRG's coupling efficiency is angle dependent, the out-coupled beams from the SRGs have different coupling efficiencies resulting in an amplitude modulation artifact in the field of view (FOV). On the other hand, due to a small range of in-coupled angles, the output beam from each of these angles may not have a complete spatial overlap. These artifacts may potentially degrade the perceived image quality produced by a laser-based display application.

Figure 1:
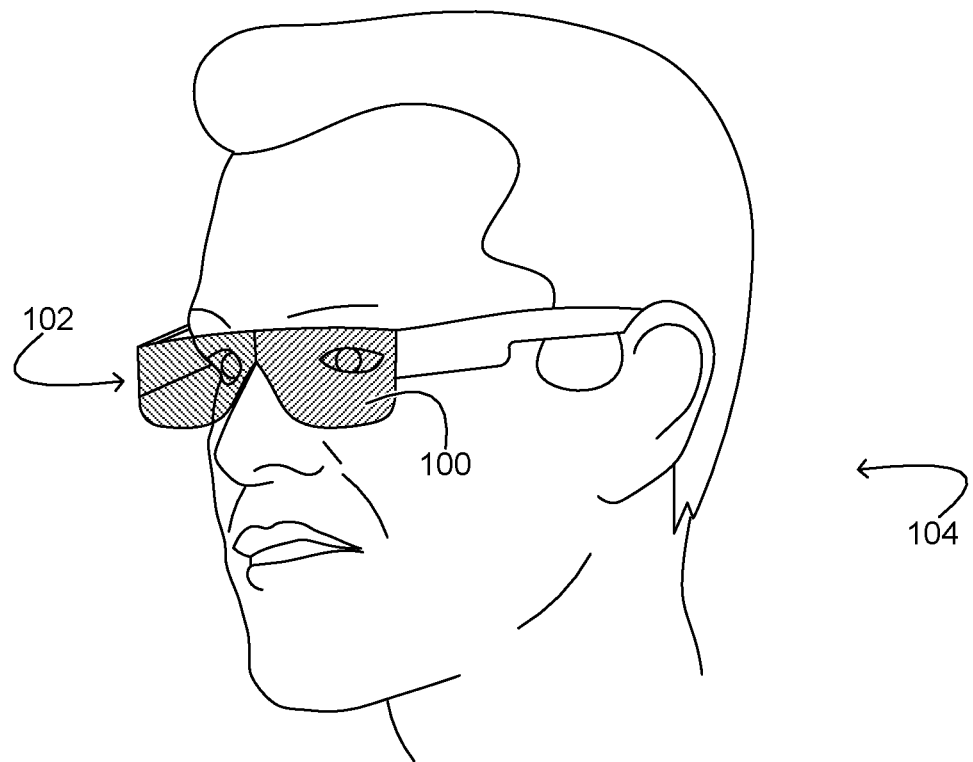
FIG. 1 shows aspects of an example implementation environment for a near-eye display system.

To address these issues and to mitigate image artifacts such as interference fringes and color nonuniformity, FIG. 1 illustrates an example near-eye display system 100 that implements a laser light source having a larger range of wavelengths than typical laser devices. As will be discussed in more detail below, the larger range of wavelengths may potentially result in a larger range of diffraction angles which leads to a smoother spatial variation of the grating efficiency as well as an improved spatial overlap of the out-coupled light.

As illustrated herein, near-eye display system 100 is a component of a head-mounted electronic device 102, which is worn and operated by a user 104. The near-eye display system 100 is configured to present virtual imagery in the user's field of view. In some implementations, user-input componentry of the wearable electronic device 104 may enable the user to interact with the virtual imagery. The wearable electronic device 102 takes the form of eyeglasses in the example of FIG. 1. In other examples, the wearable electronic device 102 may take the form of goggles, a helmet, or a visor. In still other examples, the near-eye display system 100 may be a component of a non-wearable electronic device, such as a heads-up display. However, it should be appreciated that the broad emission spectrum of the example laser light source implementations discussed herein may also benefit other applications such as, for example, fiber optic gyroscopes (FOG) and optical coherence tomography (OCT).

The near-eye display system 100 may be configured to cover one or both eyes of the user 104 and may be adapted for monocular or binocular image display. In examples in which the near-eye display system 100 covers only one eye, but binocular image display is desired, a complementary near-eye display system may be arranged over the other eye. In examples in which the near-eye display system covers both eyes and binocular image display is desired, the virtual imagery presented by near-eye display system 100 may be divided into right and left portions directed to the right and left eyes, respectively. In scenarios in which stereoscopic image display is desired, the virtual imagery from the right and left portions, or complementary near-eye display systems, may be configured with appropriate stereo disparity so as to present a three-dimensional subject or scene.

Figure 2:
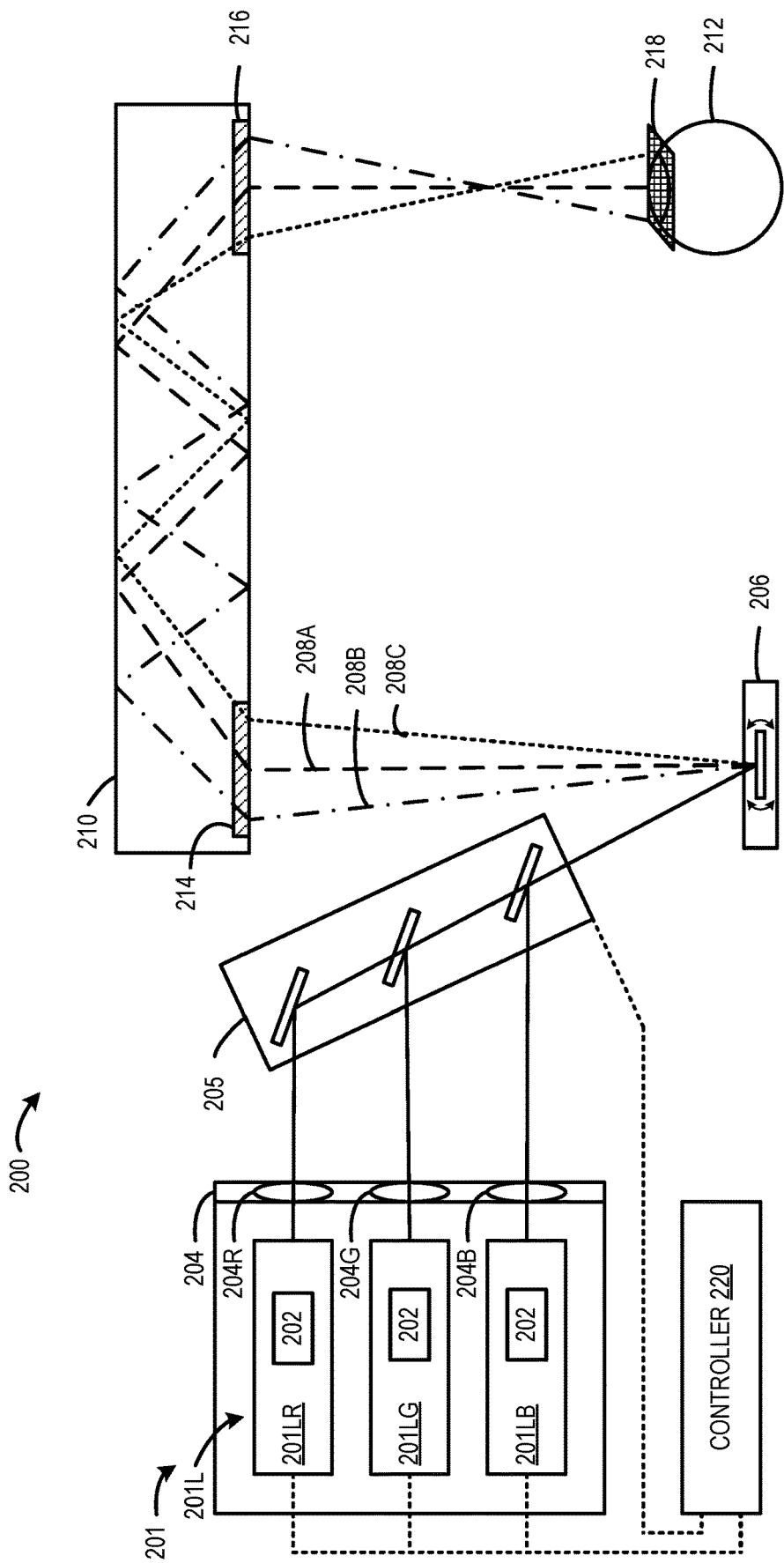
FIG. 2 schematically shows an example configuration of the near-eye display system of FIG. 1.

FIG. 2 shows an example micro-electro-mechanical system (MEMS) laser scanning display device 200 that may be incorporated into the near-eye display system 100 of FIG. 1, or other near-eye display system. The MEMS laser scanning display device 200 uses a laser assembly 201 as a laser light source. The laser assembly 201 comprises a plurality of individual laser light sources 201L which may each emit an associated color of light. The laser light sources 201L may each be comprised of one or more laser diode emitters 202. For example, red laser light source 201LR emits red light, green laser light source 201LG emits green light, and blue laser light source 202LB emits blue light. Although only three laser light sources 201L are shown, it will be appreciated that the laser assembly 201 may include any suitable number of laser light sources 201L. For example, the laser assembly 201 may include 0, 1, 2, 3, or more than 3 red laser light sources 201LR; 0, 1, 2, 3, or more than 3 green laser lights sources 201LG; 0, 1, 2, 3, or more than 3 blue laser light sources 201LB; and 0, 1, 2, 3, or more than 3 laser diode emitters of other colors. Any combination or modification in the number of laser diode emitters may also be available (e.g., 2 red, 2 green, 2 blue, or 1 red, 1 green, 2 blue, etc.). Accordingly, any suitable number of laser light sources may be used to irradiate/illuminate pixels for generating image content. Further, each laser light source may have a suitable number of laser diode emitters 202, which may be singular or arranged in an array for example.

In some, though not all, configurations, the laser assembly 201 also includes a collimating lens assembly 204 (or other diffractive optical element) that is structured to direct light to another location or otherwise operate on the light in some manner. In this example, each of the laser light sources 201LR, 201LG, and 201LB has a corresponding collimating lens 204, individually labeled 204R, 204G, 204B. In some implementations, however, a single collimating lens may be used for more than one laser light source.

The MEMS laser scanning display device 200 includes combination optics 205 configured to spatially combine the light beams lased from the plurality of laser light sources 201LR, 201LG, and 201LB into a single light beam.

The MEMS laser scanning display device 200 includes a MEMS mirror system 206, though the principles disclosed herein are applicable to any type of laser-based display unit and not only to architectures with the MEMS mirror system 206. The MEMS mirror system 206 is configured to collect laser light from the combination optics 205, which combines light lased from three different sources (i.e., the laser light sources 201LR, 201LG, and 201LB) into a single light beam. Additionally, the MEMS mirror system 206 is configured to direct laser light 208A (which, in this example includes red laser light, green laser light, and blue laser light) to a waveguide 210. Furthermore, the MEMS mirror system 206 is configured to redirect its mirrors/mirror array so that the laser light 208A is aimed at different locations at the waveguide 210. As shown, laser lights 208B and 208C are aimed at different locations on the waveguide 210. In this manner, the MEMS mirror system 206 is able to route light to different locations by adjusting the aim of its corresponding mirror array. It will be appreciated that the laser lights 208A-C may be modulated to include varying degrees or intensities (or even an absence of any one or more) of red, green, blue, or other color, laser light.

The waveguide 210 is configured to redirect or propagate the laser light 208A-C to a desired location which is viewable by a user's eye 212. It will be appreciated that waveguide 210 may be any type of waveguide display (e.g., a surface relief grating waveguide).

The laser light 208A-C enters the waveguide 210 via an entry grating 214. The laser light 208A-C then propagates (e.g., via total internal reflection) through the waveguide 210 until it reaches an exit grating 216. It will be appreciated that the angles with which the laser light 208A-C enters the waveguide 210 are preserved as the laser light 208A-C propagates through the waveguide 210. This condition is shown by the different angles that each of the respective laser lights 208A-C propagate through the waveguide 210. By configuring the entry grating 214 and the exit grating 216 to meet certain design parameters, the MEMS mirror system 206 is able to use waveguide 210 to propagate light towards the user's eye 212.

The laser assembly 201 and the MEMS mirror system 206 may be controlled by a controller 220. The controller 220 may be configured to control the MEMS mirror system 206, in conjunction with the laser assembly 201 to progressively scan a set of pixels 218 to a target display area for a user's eye 212 to view (e.g., by adjusting the mirror array so that the combined RGB laser beam or light is aimed at different locations) individual pixels of that image in such a rapid manner that the entirety of the image appears before the user's eye 212 without the user realizing that the image was progressively scanned pixel by pixel and line by line. In this way, the MEMS laser scanning display device 200 may project or render image content for a user to view.

The MEMS mirror system 206 may be able to scan an image (i.e., pixels of that image) at any image resolution or range of image resolutions (e.g., in cases where foveated rendering is used). For example, in some implementations, the MEMS mirror system 206 is configured to scan RGB light from the laser assembly 201 with a resolution of 2,000 pixels by 1,200 pixels, or any other resolution.

Figure 3:
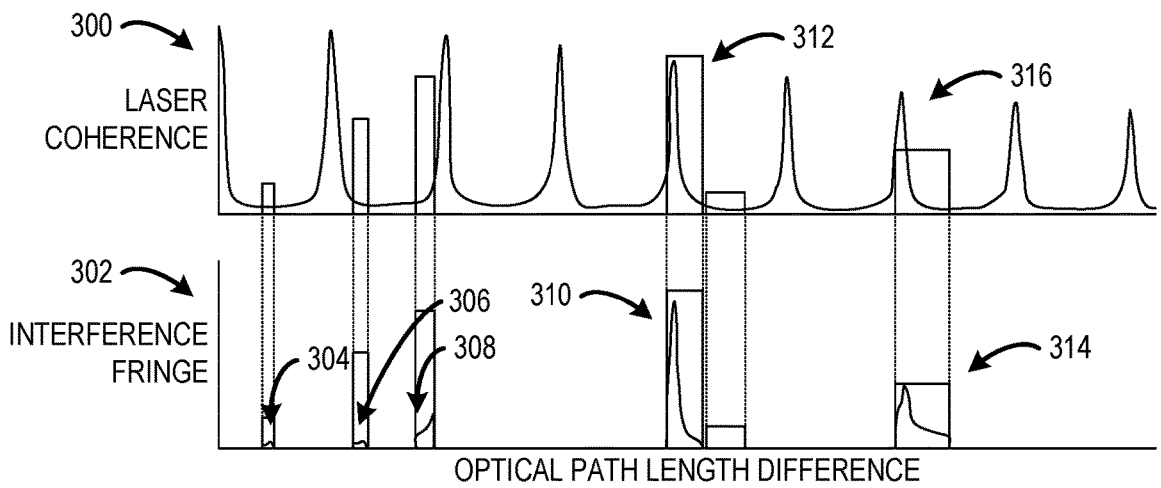
FIG. 3 shows a graph indicating that light output from a laser diode emitter, such as the laser diode emitter of FIG. 2, has coherence peaks that overlap with interference fringes of a waveguide.

There are various instances in which, due to the wave properties of laser light, fringe interference can occur. Laser light output from the waveguide is a composite of multiple separate waveforms with different optical path lengths (OPLs). Such a composite waveform may have multiple peaks (i.e., coherence peaks where OPLs of different light beams have temporal coherence) and valleys as a result of combining each of the multiple waveforms. FIG. 3 shows a graph 300 of an example composite waveform of laser light output from a laser diode emitter. The composite waveform has a plurality of coherence peaks spaced apart by valleys. The distance between the coherence peaks is proportional to the effective length of the optical cavity of the laser diode emitter. The shape of the coherence peaks is defined by the laser gain spectrum of the laser diode emitter. In this example, the active gain section occupies the entire optical cavity and has a length of 300 μm.

Figure 4:
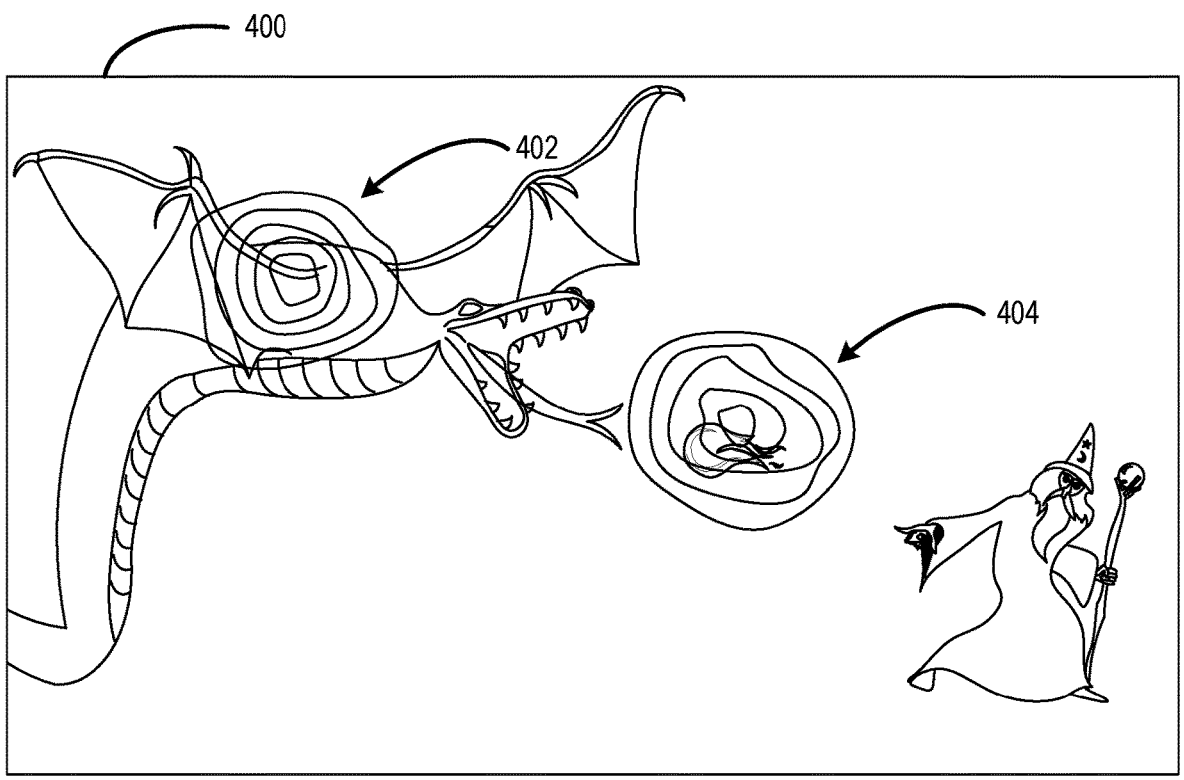
FIG. 4 shows an example image having interference fringe artifacts, due to the coherence peak overlaps of FIG. 3.

Additionally, FIG. 3 shows a graph 302 of interference fringes of the waveguide. In instances where the interference fringes do not overlap with the coherence peaks of the laser light, the interference fringes do not create artifacts in an image output from the waveguide. In the depicted example, interference fringes 304, 306, and 308 do not overlap with coherence peaks of the laser light and thus do not create artifacts in the image. However, interference fringe 310 overlaps with coherence peak 312 and interference fringe 314 overlaps with coherence peak 316. These overlapping interference fringes create artifacts in the image output from the waveguide. For example, these interference fringes may result from input laser light into the waveguide bouncing back and forth a few times and then combining with itself exiting the waveguide. As a result of these interference fringes, various different bright and dark rings/spots are created. FIG. 4 shows an example image 400 including artifacts 402 and 404 caused by such interference fringes. The artifacts 402, 404 include irregularities in terms of brightness. The presence of such artifacts in an image can lower the perceived quality of the image and thereby negatively affect the user experience. In the depicted example, the artifact 402 distorts the appearance of a dragon in image 400. Further, the artifact 404 distorts the appearance of a fireball shot by a wizard at the dragon.

As discussed above, another potential image artifact that may occur due to the narrower spectra of lasers is color nonuniformity. The cause of this artifact is generally illustrated in FIG. 5A and FIG. 5C. FIG. 5C illustrates a typically narrow bandwidth of laser light, while FIG. 5A illustrates the dispersive nature of SRGs. The incoming light of narrow bandwidth such as shown in FIG. 5C couples inside the waveguides only at a small range of angles, due to the dependence of the diffraction on wavelength: $\theta(\lambda)$. Considering that the SRG's coupling efficiency is angle dependent, the out-coupled beams from the SRGs have different coupling efficiencies (see E1-E3 in FIG. 5E), resulting in an amplitude modulation artifact in the field of view (FOV). Thus, a narrow lasing spectrum (FIG. 5C) due to the small range of in-coupled angles when passed through the SRG (FIG. 5A) can form an output beam (E1-E3 of FIG. 5A and FIG. 5E) from component light paths have been coupled at varied coupling efficiencies by the SRG, negatively affecting the color uniformity.

On the other hand, FIG. 5B illustrates an example configuration of a waveguide receiving light from a spectrally broad laser diode emitter that may be used in near-eye display system 100 described herein. As shown, due to the spectrally broad light source, the bandwidth of which is illustrated in FIG. 5D, the light inside the waveguide couples in via an SRG and propagates through the wave guide at a larger range of angles as compared to the example shown in FIG. 5A. The larger range of angles may provide several potential benefits. For example, as illustrated in FIG. 5B, the larger range of angles may provide a correspondingly larger spatial coverage of the out-coupled beam, which may result in a more uniform image. As another example, the broad spectrum light source may provide a relatively smoother change of SRG out-coupling efficiency from E1 to E3 as shown in FIG. 5B as compared with the abrupt efficiency points in the narrower spectrum light source example of FIG. 5A. FIG. 5E is a graph showing that the SRG grating's efficiency dependence on the in-coming light angle. It will be appreciated that the solid dots representing outcoupled beams from the spectrally broad light source of FIG. 5D are densely and evenly spaced along the efficiency/angle line, as compared to the white dots representing the outcoupled light from the spectrally narrower light source of FIG. 5C. As a result of the more uniform spatial distribution of the light paths within the waveguide, greater color uniformity is achieved by use of the spectrally broad light source.

Figure 6:
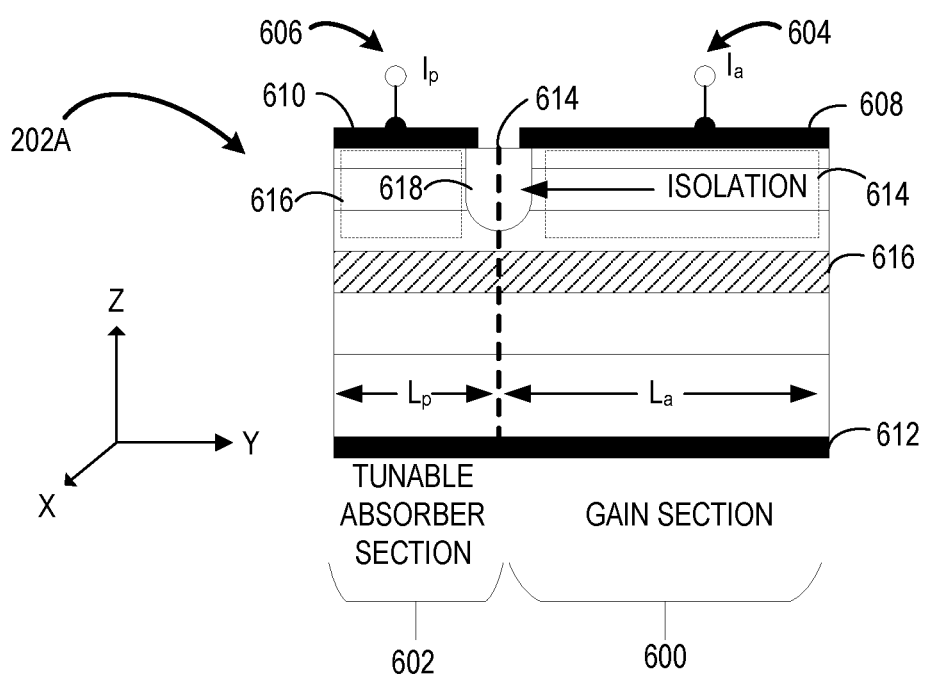
FIG. 6 is a cross-sectional view of a laser diode emitter that may be used in the system of FIG. 1, featuring a tunable absorber section and a gain section.

Several configurations for laser light sources 201L including laser diode emitters 202 that achieve emission of spectrally broad light will now be described. FIG. 6 illustrates one embodiment for a laser diode emitter 202A that emits spectrally broadened light and can be incorporated as a laser diode emitter 202 of any color of laser light source including 201LR, 201LG, and 201LB in near-eye display system 100 described above. Laser diode emitter 202A can thus take the form of a laser diode emitter for use in a MEMS laser scanning display device having a laser cavity that includes a gain section 600 and a tunable absorber section 602. FIG. 6 illustrates a schematic view of a vertical cross-section along a Y-Z plane of a laser diode emitter. As shown, the laser diode emitter 202A may include a substrate 612 that extends across the X-Y plane shown in FIG. 6. The various layers of laser diode emitter 202A may be directly or indirectly deposited on top of the substrate 612 in a series of layers. The gain section 600 and tunable absorber section 602 are sections of the laser cavity of the laser diode emitter 202 that extend vertically along the Z-axis from the substrate 612. A dividing line 614 is shown to schematically illustrate a boundary between the gain section 600 and the tunable absorber section 602. However, it should be appreciated that the various layers of the laser diode emitter 202A may extend through both the gain section 600 and the tunable absorber section 602. For example, at least a quantum well layer 616 may extend through each of the gain section 600 and the tunable absorber section 602 within the laser cavity of the laser diode emitter 202A.

As illustrated in FIG. 6, the gain section 600 is coupled with a first current or voltage source 604, and the tunable absorber section 602 is coupled with a second current or voltage source 606. The first current or voltage source 604 is coupled to the gain section 600 via a first electrode 608, and the second current or voltage source 606 is coupled with the tunable absorber section 602 via a second electrode 610. In one example, at least a portion of the gain section 600 is electrically isolated from at least a portion of the tunable absorber section 602. For example, the first electrode 608 coupling the gain section 600 to the first current or voltage source 604 may be separated from the second electrode 610 coupling the tunable absorber section 602 to the second current or voltage source 606. As the first electrode 608 and the second electrode 610 are separated, the drive currents supplied by the first and second current or voltage sources will be injected to the respective portions of the gain section 600 and tunable absorber section 602 that lie underneath the first and second electrodes.

In the example illustrated in FIG. 6, a portion 614 of the gain section located under the first electrode 608 will be supplied with a voltage or current from the first voltage or current source 604, while the portion 616 of the tunable absorber section located under the second electrode 610 will be supplied with a voltage or current from the second voltage or current source 606. As the first electrode 608 and second electrode 610 are electrically separated, separate drive voltages or currents may be supplied to the portion 614 of the gain section and the portion 616 of the tunable absorber section. In one example, the portion 614 of the gain section and the portion 616 of the tunable absorber section 602 are further electrically isolated from each other via a notch 618 that extends downward from the first and second electrodes into the top layers of the laser diode emitter 202A. In the illustrated example, the notch 618 electrically isolates the two terminals for receiving the drive currents Ia and Ip for each of the gain section 600 and tunable absorber section 602, respectively, as well as the first few layers of the laser diode emitter diode (e.g. portions 614 and 616).

In the example laser diode emitter 202A illustrated in FIG. 6, the gain of the gain section 600 may be controllably varied by a gain drive current supplied by the first voltage or current source 604. The tunable absorber section 602 is drivable by the second voltage or current source 606 to adjust a bandwidth of the emitted laser light. The amount of current delivered to the tunable absorber section 602 is inversely related to the capability of the tunable absorber section 602 to absorb photons at certain wavelengths. Thus, as more drive current is supplied to the tunable absorber section 602, the absorber experiences a reduction in its ability to absorb photons at certain wavelengths. Wavelengths of light not absorbed by the tunable absorber section 602 are available for amplification by the gain section 600. Thus, by changing the current applied to the tunable absorber section 602, the spectrum of laser light can also be changed. By applying a pulse absorber drive current, also referred to as "chirping" the tunable absorber section 602 herein, at modulated current levels, a target gain spectrum may be achieved. The effects of tuning the semiconductor laser diode emitter 202A in this manner, using the described combination of a chirped tunable absorber section and integrated gain section, may be measured using Hakki-Paoli measurements on the laser gain spectrum (which indicates loss at negative values), for example.

It should be appreciated that a laser is composed of a gain material in a cavity, and lasing starts once the gain equals the loss inside the cavity. Hence, laser spectral bandwidth is determined by the wavelength range where the gain spectrum ($\Gamma g - \alpha i$) exceeds the reflector loss $\alpha m(\lambda)$. By shifting the wavelength at which the loss is minimum or has the maximum overall gain inside the cavity, the lasing wavelength will shift. However, for a larger shift in the lasing wavelength, the gain spectrum may also be flattened over a larger wavelength range to mitigate potential problems due to the lasing wavelength being potentially limited by the gain spectral peak. By chirping the tunable absorber section 602 fast enough (faster than one-pixel time and faster than the overall response time of the laser to the input currents driving the gain and absorber sections before getting to a steady state regime response), the laser spectrum of laser diode emitter 202A may be broadened.

Accordingly, the second voltage or current source 606 is configured to supply a drive current or voltage that sweeps through a range of values over a period of time to cause a shifting of a wavelength of the laser diode emitter 202A at which an overall gain is at maximum, to thereby cause the laser diode emitter 202A to emit spectrally broadened light. As used herein, the term "spectrally broadened light" is used to describe a laser light spectrum that has been broadened as compared to a laser light spectrum emitted by a conventional laser diode emitter that emits light with a single gain peak and narrow bandwidth.

Figure 7:
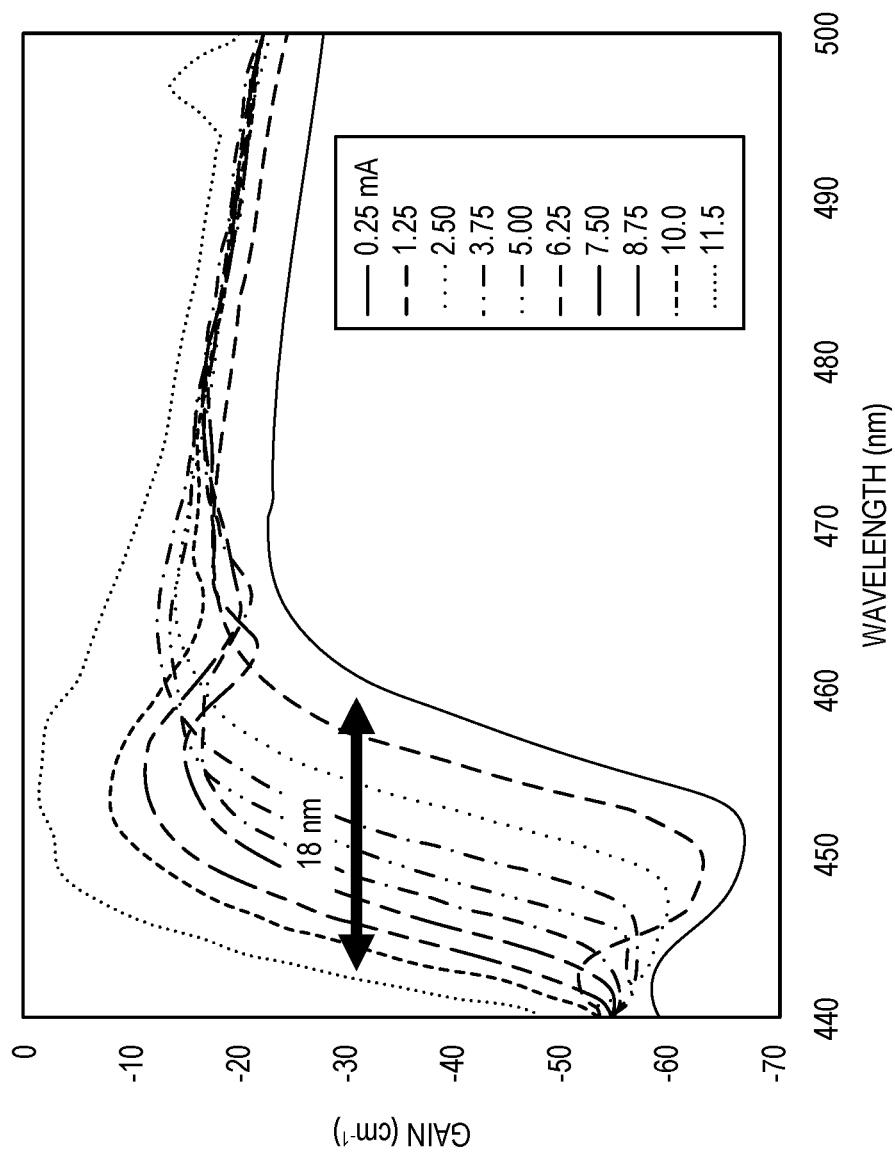
FIG. 7 is a graph of emitted light spectrum of the laser diode emitter of FIG. 6, illustrating a relationship between gain and wavelength for each of several tunable absorber drive currents.

As illustrated in FIG. 7, an absorption spectral edge inside the tunable absorber section 602 is shifted by 1 to 20 nanometers over the range of values supplied by the second current or voltage source 606. More specifically, the absorption spectral edge shifts by 18 nm when changing the injected current into the tunable absorber section 602 within the range of 0.25 mA to 11.5 mA. In one example, the second current or voltage source 606 may be configured to sweep through the range of values (e.g. 0.25 mA to 11.5 mA) over a period of time between 2 nanoseconds and 20 nanoseconds. More particularly, the second current or voltage source 606 may be configured to sweep through the range of values in a time period defined by a single-pixel display time, which is typically 4 nanoseconds. As another example, the second current or voltage source 606 may be configured to sweep through the range of values over other time periods, such as, for example, four-pixel display times, which is typically 16 nanoseconds. It should be appreciated that these time periods are merely exemplary, and that any suitable time period may be selected for sweeping through the range of values.

Figure 8A:
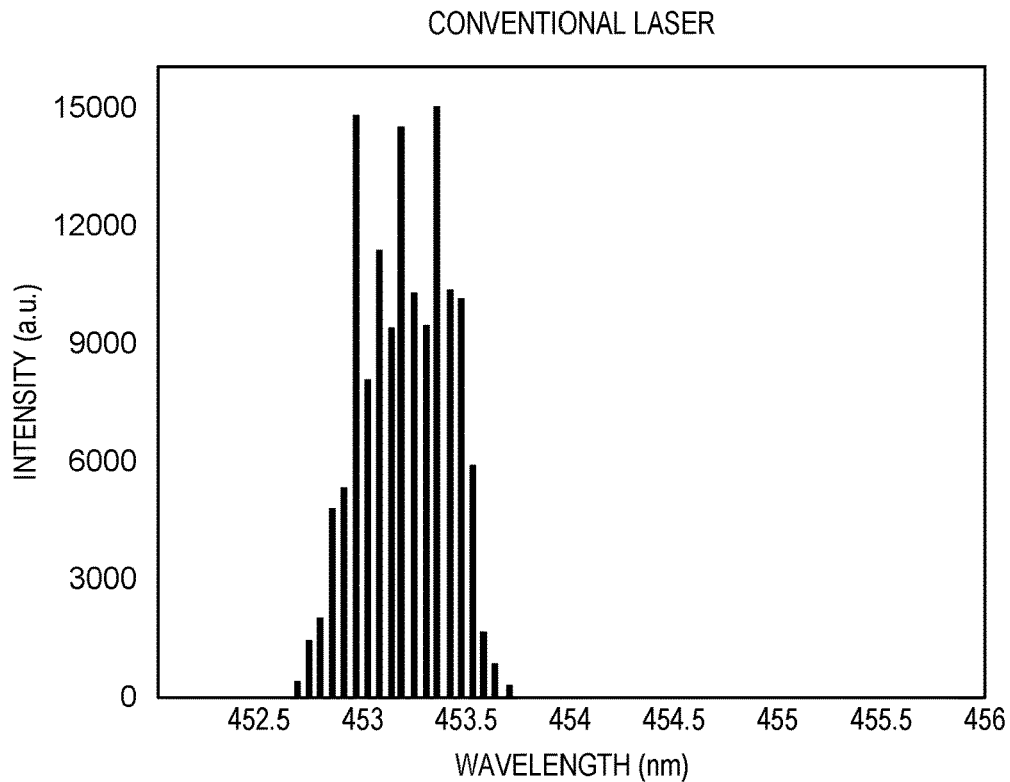
FIGS. 8A-8B illustrate emission spectra from a conventional laser and from a laser diode emitter shown in FIG. 6 with a tunable absorber section without a flattened gain profile.
Figure 8B:
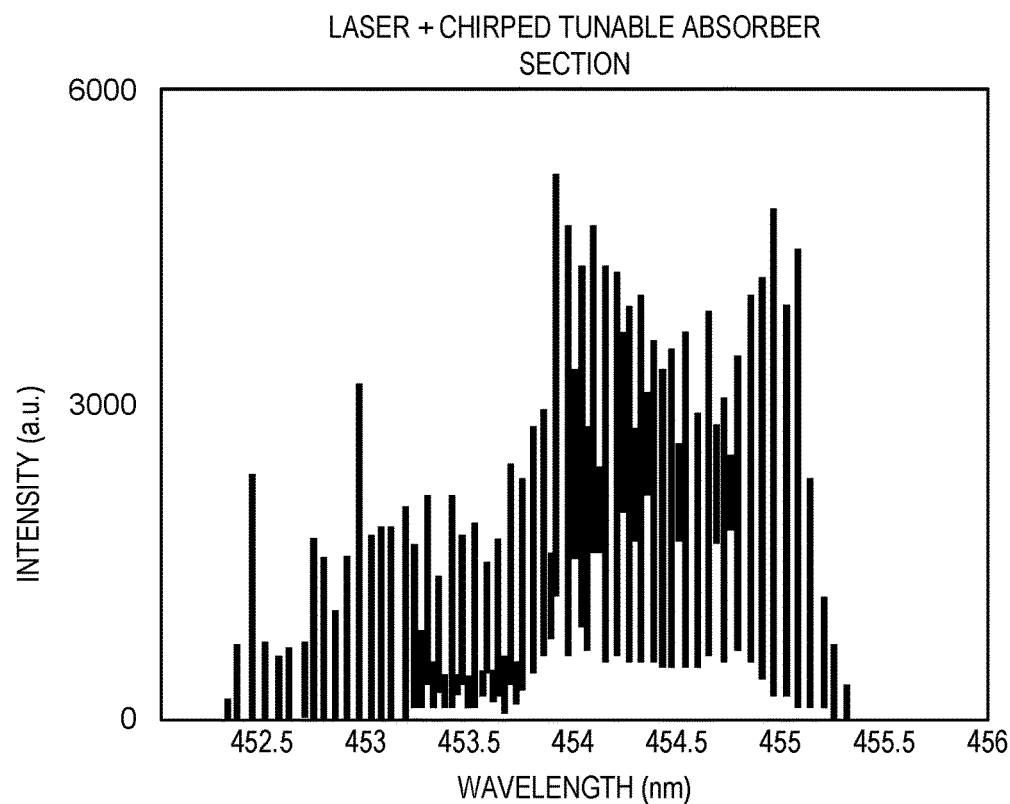

However, as described above, the lasing spectrum is also determined by the gain spectral shape. Thus, the overall bandwidth of the emitted laser light may potentially not reach the full 18 nm shift shown in FIG. 7. Rather, as shown in FIGS. 8A-B, for an absorber drive current driven in a pulsed manner to vary between 0.25 mA and 11.5 mA, supplied to the tunable absorber section 602, the wavelength at which the overall gain is at maximum shifts, and hence the overall spectrum changes from approximately 1 nm in bandwidth as shown at FIG. 8A to a broader range of approximately 3 nm in bandwidth as shown at FIG. 8B.

To take advantage of the whole absorption tuning bandwidth of 18 nm in this example, flattening the gain spectrum over a bandwidth equal to or larger than 18 nm may provide advantageous benefits. Thus, in one example, the gain section 600 of the laser diode emitter 202A may be configured to have a flattened gain spectrum. As used herein, the term "flattened gain spectrum" may be used to describe a gain spectrum that has a substantially flattened peak, such as by including a plurality of peaks at different wavelengths. A flattened gain spectrum may have a flattened peak as compared to a typical gain spectrum of a conventional laser diode emitter that has a sharper peak.

Figure 17:
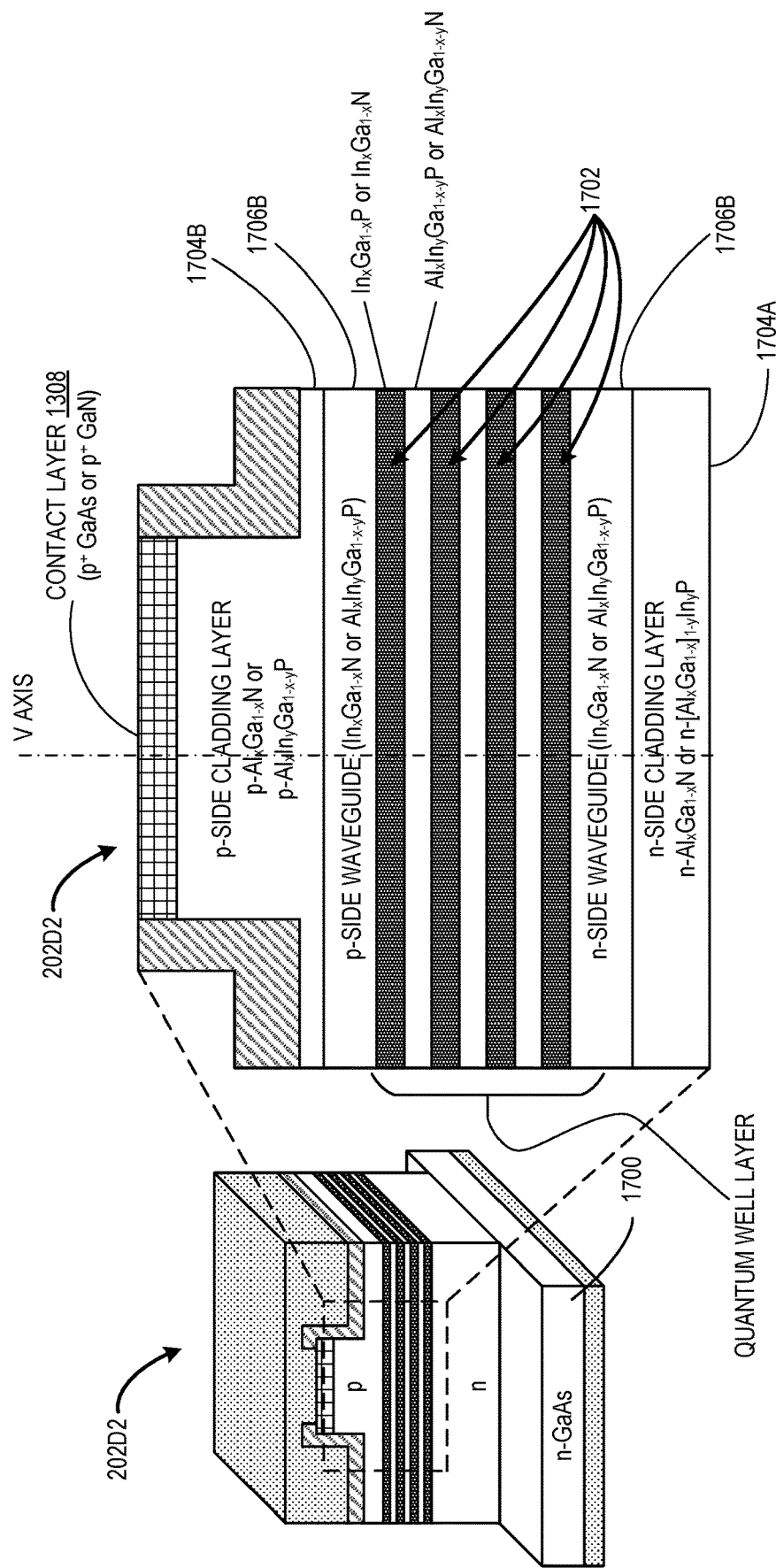
FIG. 17 shows perspective and side views of an example configuration of the laser diode emitter of FIG. 13.
Figure 18:
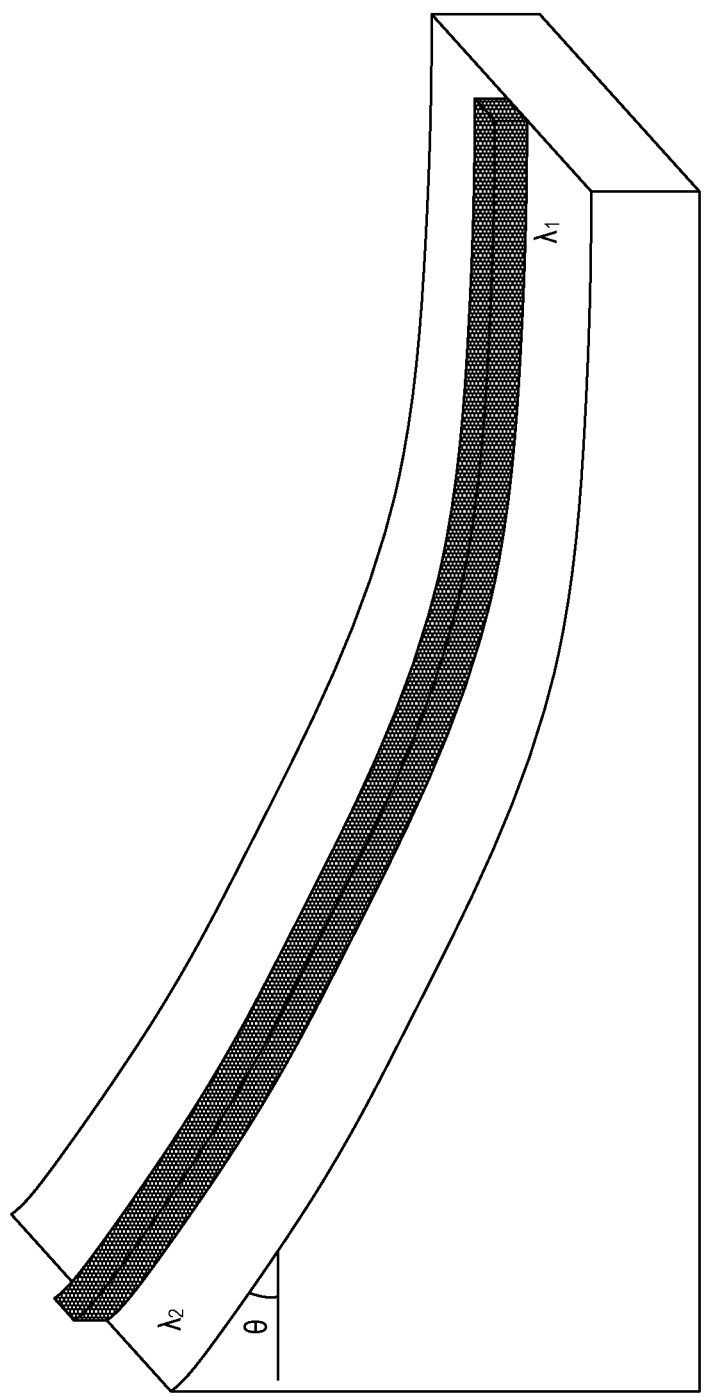
FIG. 18 shows an example configuration of the laser diode emitter of FIG. 6, which features spatially varied substrate surface vicinal angles prior to epitaxial growth along a waveguide.

One proposed method discussed thus far has been to use the structure shown in FIG. 6 to increase the lasing bandwidth. In order to increase the bandwidth of emitted light from this embodiment even further, the gain spectrum may be flattened through various approaches for flattening the gain spectrum of single emitters, such as growing non-uniform multiple quantum wells for a laser diode emitter to achieve a single emitter with a flat and broad gain spectrum that is uniform across the wafer and along the waveguide of the laser diode emitter, as shown in FIG. 17. This approach achieves an emitter structure in which quantum well sections of the multiple quantum well layers each have different composition, thickness, and/or strain in the quantum well layer, which causes them to lase at different peak wavelengths. Another approach for flattening the gain spectrum of single emitters that may be used with the embodiment of FIG. 6 is shown in FIG. 18, and includes an emitter structure that features spatially varied substrate surface vicinal angles prior to epitaxial growth along a waveguide of a single laser diode emitter to achieve a structure with different vicinal angles along the waveguide of the laser diode emitter, which results in a laser diode emitter with a flattened gain spectrum. In FIG. 18, along the laser diode waveguide, the substrate vicinal angle is changed. FIG. 18 depicts one particular example in which the change is a parabolic change; however, it will be appreciated that other changes in vicinal angle along the waveguide are also contemplated. For every angle along the waveguide, the indium incorporation, and hence the lasing wavelength, is different. In this specific example, along the waveguide the substrate angle gradually changes from 0 to $\theta$, hence the lasing wavelengths gradually changes from $\lambda_1$ to $\lambda_2$ covering a range between the two. Typically, $\theta$ is a small angle that is less than 2° (although other ranges of values are possible), and thus it will be appreciated that the FIG. 18 is not to scale and the change in $\theta$ is exaggerated for illustrative purposes.

Figure 19A:
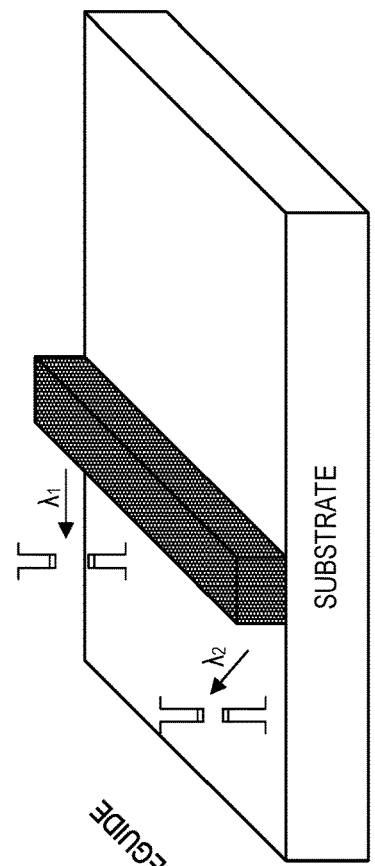
FIGS. 19A-19C illustrate a configuration of the laser diode emitter of FIG. 6, which features quantum well intermixing along the wave guide, to vary the gain material bandgap along the waveguide and thereby achieve a laser diode emitter with spectrally broadened gain.
Figure 19B:
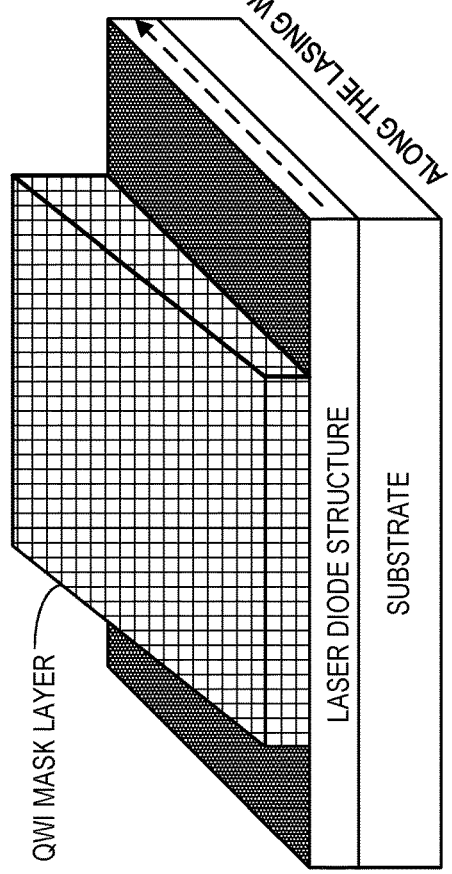
Figure 19C:
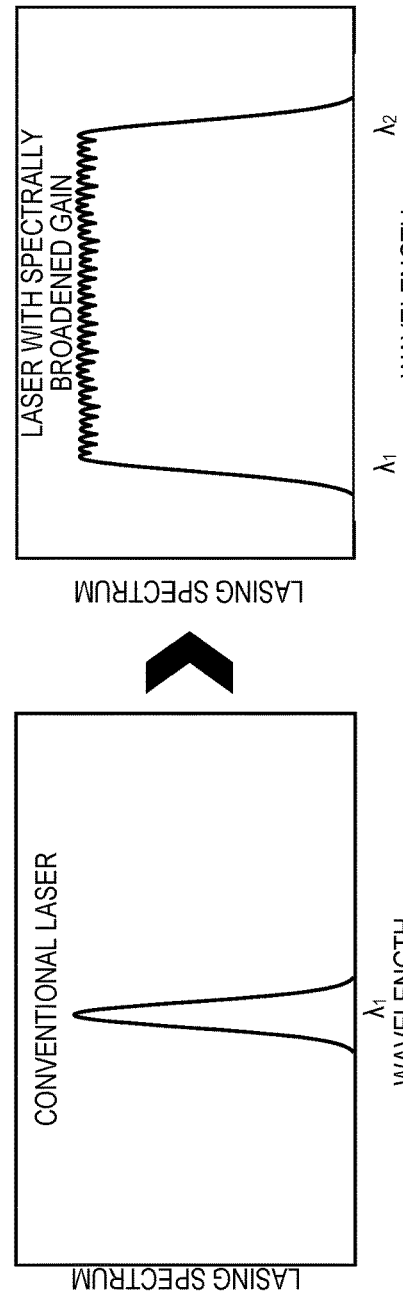

Another approach may include quantum well intermixing in the quantum well layer along the waveguide after epitaxial growth to achieve a single laser diode emitter with a flattened gain spectrum, as shown in FIGS. 19A-19C. As shown in FIG. 19A, a thickness of a quantum well intermixing mask layer formed along the waveguide and on the laser diode stack structure is varied. The laser diode stack with mask layer is subject to annealing at high annealing temperatures, thereby causing quantum well intermixing along the waveguide, and then removed. Due to the differences in thickness of the mask layer, indium incorporation along the waveguide due to the quantum well intermixing, and hence the gain material bandgap along the waveguide, will gradually change as shown in FIG. 19B, resulting in a flatter gain and a broader range of the lasing spectrum, as shown in FIG. 19C.

Figure 20B:
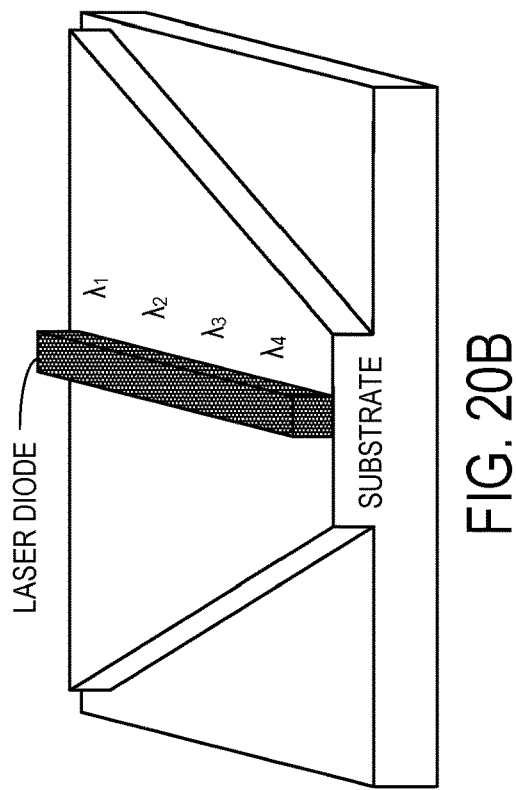
FIGS. 20A-20C illustrate an example configuration of the laser diode emitter of FIG. 6, which features a patterned substrate prior to epitaxial growth along the waveguide of the laser diode emitter.
Figure 20A:
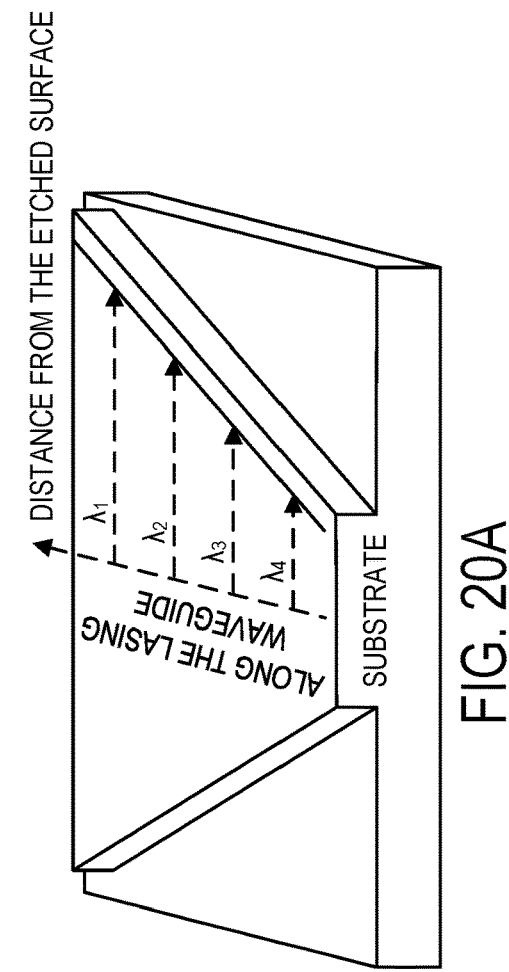
Figure 20C:
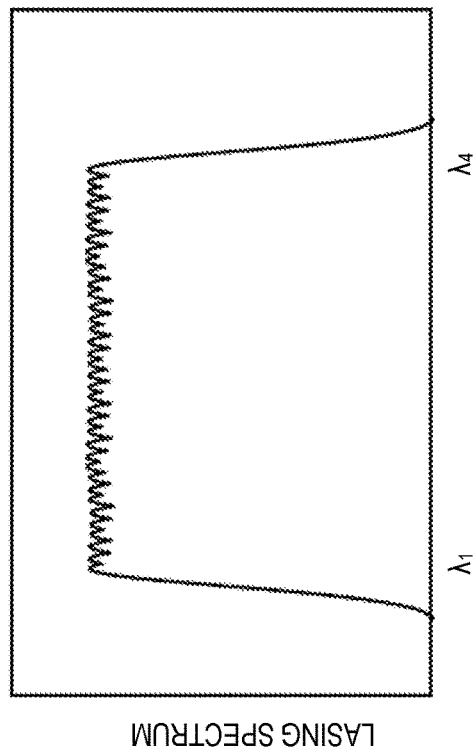

Another approach may include using a patterned substrate prior to epitaxial growth along the waveguide of the laser diode emitter, as shown in FIGS. 20A-20C. As shown in FIG. 20A, patterning the substrate may be accomplished by, along the laser waveguide, changing growth factors such as the growth rate (and hence the quantum well thickness) depending on the distance from the etched patterned area. This results in a change of lasing wavelength along the waveguide as shown in FIG. 20B from $\lambda_1$ to $\lambda_4$. Growing the epitaxial layers and processing the waveguide in this manner produces a laser that lases at a broader range of wavelengths in the emitted lasing spectrum, as illustrated in FIG. 20C. It should be noted that other forms of patterns on the substrate prior to the growth of the epitaxial layers could be used to achieve a similar result.

Figure 9A:
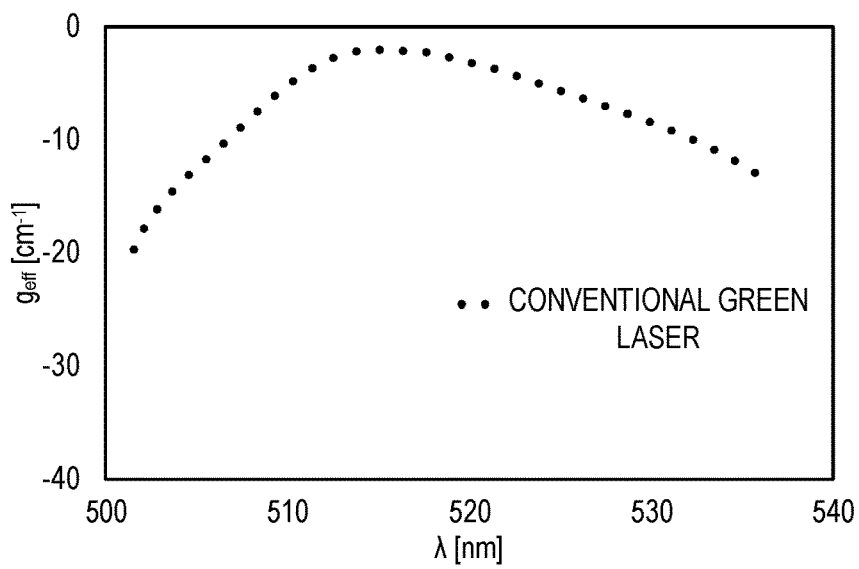
FIGS. 9A-9C illustrate flattening of the gain spectrum of a laser diode emitter such as the laser diode emitter of FIG. 6, using the varying indium incorporation techniques described below in relation to FIGS. 11A-B.
Figure 9B:
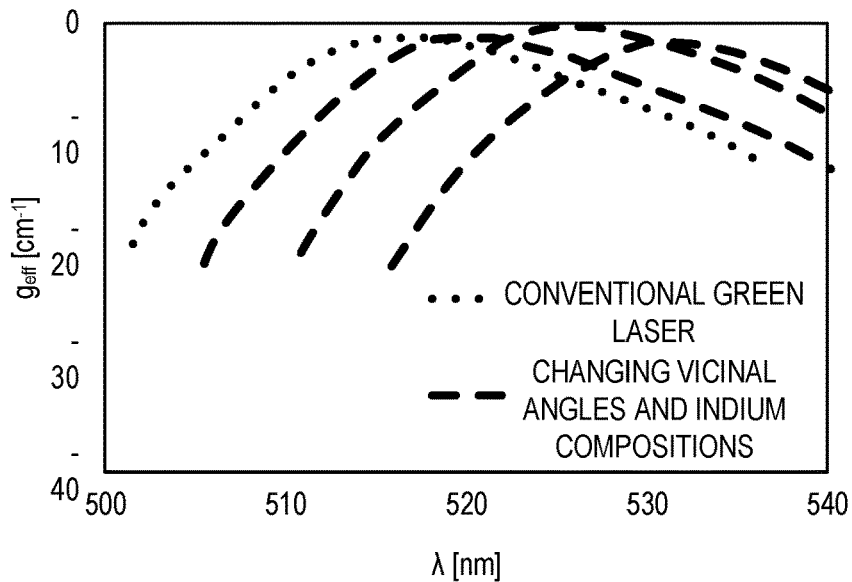
Figure 9C:
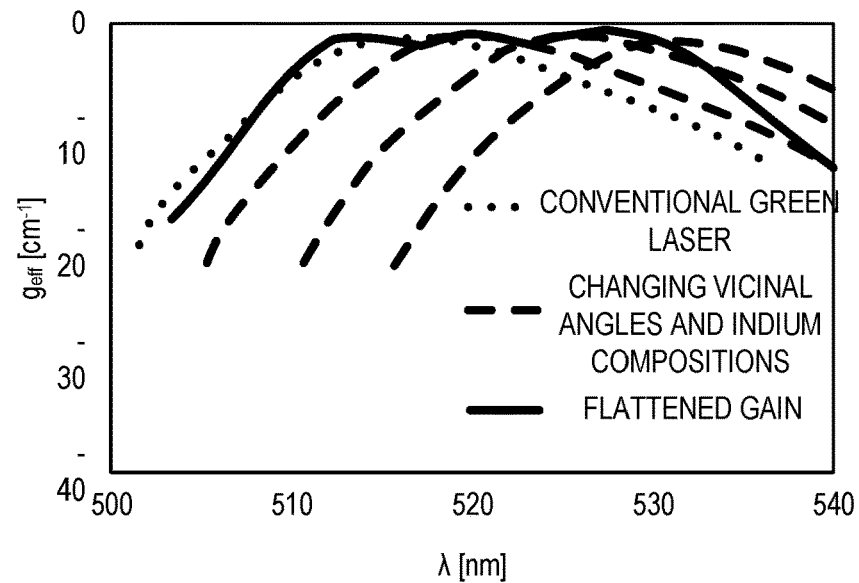

Turning now to FIGS. 9A-C, an example flattened spectrum achievable through one of the above discussed approaches (spatially varied substrate surface vicinal angles prior to epitaxial growth along a waveguide of a laser diode emitter) is shown, where a combination of spectra centered at different wavelengths will result in an overall broader spectrum which is substantially flat over a larger range of wavelengths. FIG. 9A shows the gain spectrum of a laser with single emitter in which there is a maximum at approximately 515 nm. FIG. 9B shows an overlay of the spectrum of FIG. 9A and three additional spectra similarly shaped, but with local maxima at approximately 520 nm, 525, and 530 nm. When viewed from left to right, each of these individual spectra may be described as a concave waveform with a leading edge, a local maximum, and a trailing edge. The gain in these individual spectra decreases as the wavelength deviates from the local maximum. However, in FIG. 9C, an overlay of the four spectra shows that between the maxima at approximately 515 nm and 530 nm, the overlay remains relatively flat when compared to any of the individual spectra. Thus, as shown in FIG. 9C, the flattened gain spectrum has a substantially flatter top as compared to a typical gain spectrum of a conventional laser shown in FIG. 9A.

As an alternative to the approach shown in FIG. 6 using a tunable absorber, and as an alternative to the single laser diode emitter with multiple quantum wells of FIG. 17, FIGS. 10-16 illustrate implementations of laser emitter arrays configured for broad spectrum outputs by spatially distributing individual emitters that have been tuned through various processes to emit light of slightly different peak wavelengths. By incorporating the emitter arrays of FIGS. 10-16 into the laser diode emitters 202 of the MEMS laser scanning display device 200 of FIG. 2, the image artifacts such as fringe artifacts and color uniformity artifacts of FIG. 4 can be inhibited. It will be appreciated that embodiments of FIGS. 10-16 are merely exemplary and that other techniques for spatial distribution of the spectral bandwidth may also be adopted within the MEMS laser scanning display device 200.

Figure 10:
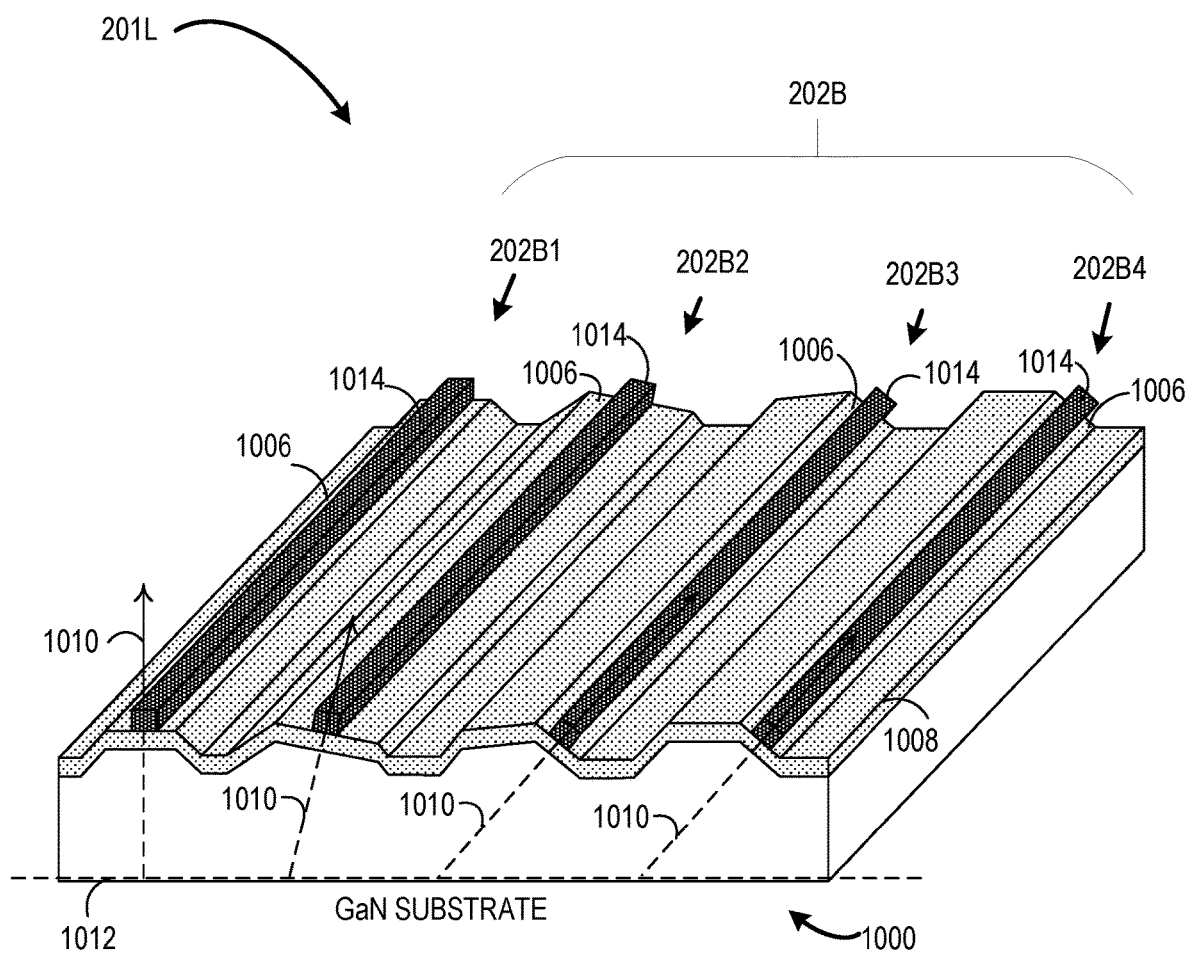
FIG. 10 is a perspective view of a laser diode array that may be used in the system of FIG. 1, incorporating laser diode emitters formed of a semiconductor material on surfaces of varying surface normal angles to thereby vary the composition of the semiconductor material, which in turn causes the emitted spectrum from each emitter to vary.

FIG. 10 illustrates another embodiment of the broad-spectrum laser light source 201L, including a light emitter array 202B of a plurality of laser diode emitters 202B1-4. The laser diode array 202B may take the form of a light-emitting device having a gallium nitride (GaN) (in the case of green or blue laser diode emitters) or gallium arsenide (GaAs) (in the case of red laser diode emitters) substrate layer 1000 and a plurality of laser diode emitters 202B1-4 formed by deposition of indium containing thin layers, such as indium gallium nitride (InGaN). The GaN or GaAS substrate 1000 has a plurality of substrate angles, which may be identical or varied, affecting the indium content in the laser diode emitters, which in turn affects the wavelength of emitted light. Thus, the effect of the plurality of laser diode emitters each with a different emission spectrum, is an overall broadened emission spectrum. While in the depicted embodiment the substrate angle of each laser diode emitter 202B1-4 is different from the others, it will be appreciated that in other embodiments some of the laser diode emitters may share a same substrate angle, so long as at least two, and typically at least multiple laser diode emitters have different substrate angles in the array.

The example broad-spectrum laser light source 201L of FIG. 10 may be incorporated in the MEMS laser scanning display device 200 shown in FIG. 2. As discussed above, the MEMS laser scanning display device may include a MEMS scanning mirror 206 configured to guide the light beam, via a waveguide 210 with an in-coupling grating 214 and out-coupling grating 216, to achieve a scanning pattern across the display and thereby form a displayed image. As discussed above with respect to FIGS. 5A-E, as compared to a laser light source that emits a light beam with an emission spectrum having a single peak, the broadband light beam increases color uniformity in the displayed image by having a larger range of wavelengths in the laser light source, which results in a larger range of diffraction angles at the in-coupling grating and out-coupling grating, which in turn causes a smoother spatial variation of the grating efficiency as well as an increased spatial overlap of the out-coupled light.

To achieve the broadband light beam described above, the MEMS laser scanning display device 200 further may include a plurality of laser light sources 201L, and each of those laser light sources may take the form of the example broad-spectrum laser light source 201L with varying substrate angles shown in FIG. 10. As illustrated, the broad-spectrum laser light source 201L includes an emitter array 202B including a plurality of laser diode emitters 202B1-4. Each laser diode emitter 202B1-4 is configured to emit respective different wavelengths of light, to thereby form a broadband light beam with a broadband emission spectrum. That is, the example broad-spectrum laser diode emitter of FIG. 10 spatially distributes a larger range of wavelengths by use of a plurality of laser diode emitters 202B1-4.

Figure 11A:
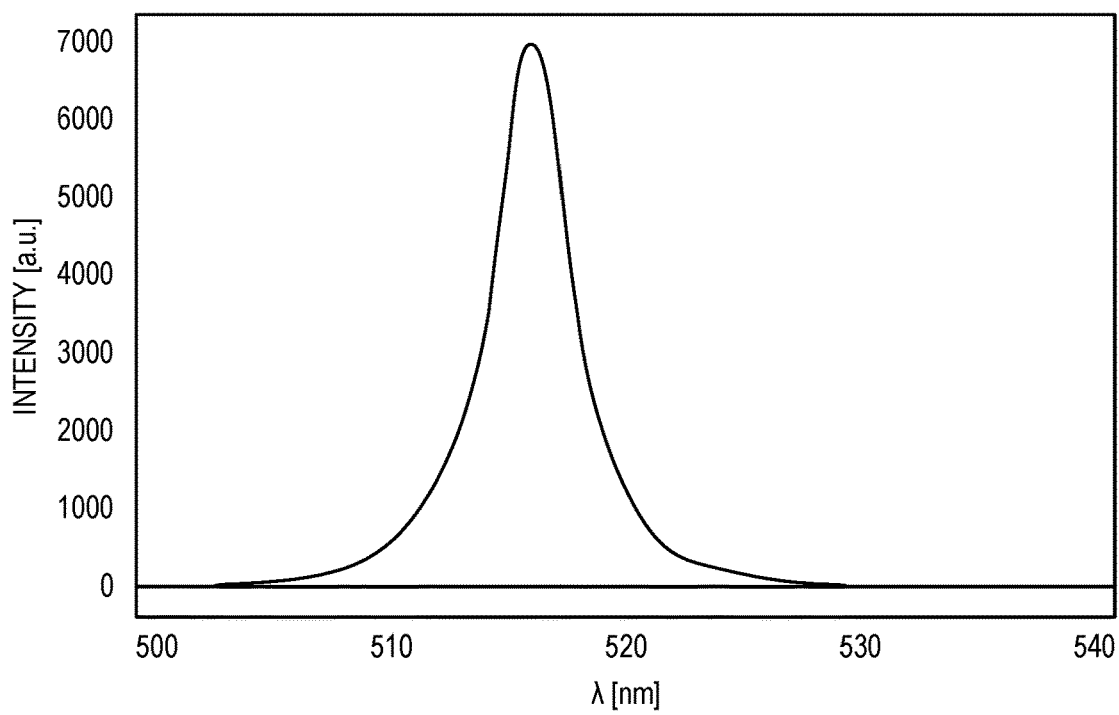
FIGS. 11A-11B illustrate broadening of the emission spectrum of a laser diode array of the configuration shown in FIG. 10 or 12, for example.

For example as shown in FIG. 11A, a typical laser diode emitter at green wavelengths has a maximum full width half maximum (FWHM) bandwidth of ~2.5 nm after pulsing the laser. If a light source with a bandwidth of ~10 nm potentially mitigates artifacts such as the ones mentioned above, four laser diode emitters each with a FWHM bandwidth of ~2.5 nm and an offset of 2.5 nm in their central wavelength may be used to achieve the potential advantages described herein.

Figure 11B:
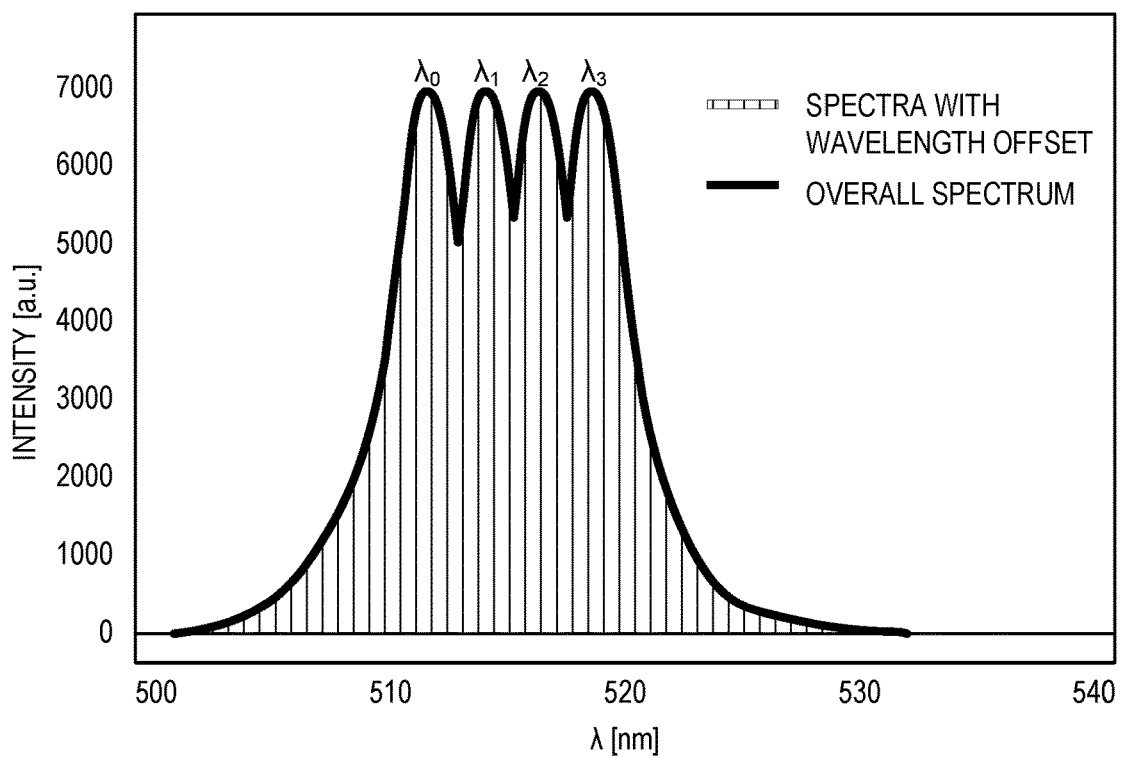

In contrast, FIG. 11B shows a superposition of the offset spectra of the plurality of laser diode emitters 202B1-4 of FIG. 10. That is, the example broad-spectrum laser light source of FIG. 10 may be configured to emit a broadband light beam that has an emission spectrum that includes a plurality of peaks, as shown in FIG. 11B. The number and the wavelength offset of the laser diode emitters may be selected based on the overall lasing bandwidth that is needed and the system level considerations and limitations of MEMS scanners with a plurality of laser diode emitters.

Turning back to FIG. 10, the laser light source may include a substrate 1000 having a plurality of deposition regions 1006 on a top surface 1008 thereof. Each deposition region 1006 has a different surface normal 1010 formed at orthogonally relative to a surface of the deposition region 1006. Each surface normal 1010 is also formed at an angle relative to a planar bottom surface 1012 of the substrate 1000. Each laser diode emitter 202B1-4 may include a semiconductor material 1014 deposited on each of the deposition regions 1006 with surface normal 1010 of different angles in semiconductor regions 1006.

The semiconductor region of each laser diode emitter 202B1-4 may be configured to emit a respective different wavelength of light, to thereby form the light beam with a broadband emission spectrum with a plurality of peaks. In one example, the semiconductor material may be InGaN, and indium incorporation in each of the deposition regions may vary due to different vicinal angles in each deposition region. The varying vicinal angles in each deposition region may also change the multiple quantum wells (MQW) thicknesses and/or the strain in the MQWs, which will result in different peak wavelengths. Further, the varying of the incorporation of indium in each of the deposition regions may also cause variation in the wavelengths of each laser diode emitter. In this manner, the substrate angle may affect the indium content, thicknesses, and/or strain in the MQWs, which determines the lasing wavelength. The substrate angle may be picked based on the wavelength offset that is needed. The physical distance between laser diode emitters may be selected based upon the following considerations: (1) maximum electrical, optical, and thermal isolation between laser diode emitters, (2) MEMS system level requirement for minimum visibility of scan lines, and (3) maximum image artifact mitigation. That is, each laser diode emitter supports a certain range of diffracted angles (θ) in the SRGs and the vicinity of laser diode emitters will result in a smoothing out of the color uniformity and other bandwidth dependent artifacts.

The example laser diode emitters act like a spectrally broadened laser diode emitter for mitigating the image artifacts discussed above in two ways. By shifting the vertical locations of scan lines in each frame, within a few frames, each pixel or line will be rendered by all laser diode emitters. Hence, the user perceives the combined frames similarly to the case of a broadband laser diode emitter for a fast-enough frame rate. Additionally, the spatial vicinity of laser diode emitters with wavelength offset where each laser diode emitter excites a different range of diffracted angles, may help reduce the artifacts visibility locally.

Figure 12:
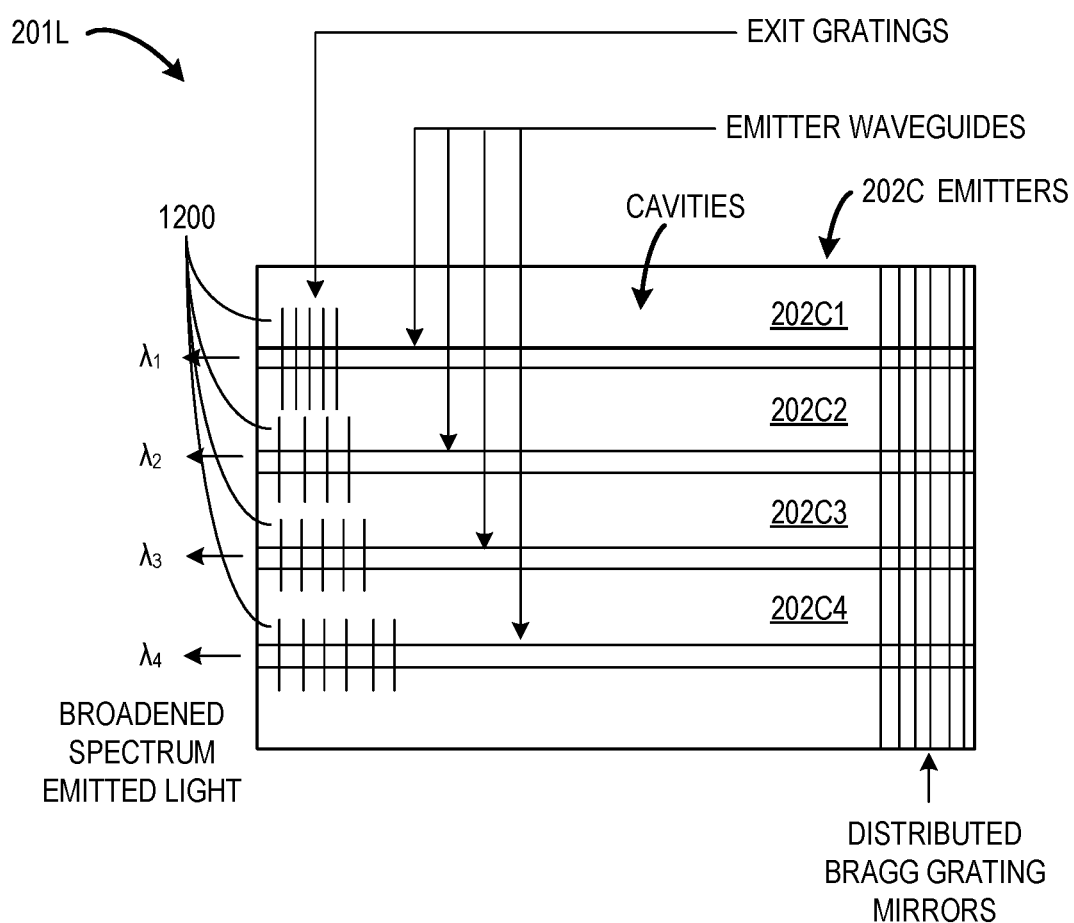
FIG. 12 illustrates a laser diode array that may be used in the system of FIG. 1 that includes a plurality of laser diode emitters configured to have the same gain material but different reflection or loss profile to make the emitters lase at different wavelengths.

FIG. 12 illustrates another example laser light source 201L for emitting spectrally broadened laser light. The example laser light source 201L may include a laser diode emitter array 202C that includes a plurality of laser diode emitters 202C1-4. Each of the plurality of laser diode emitters 202C1-4 in this configuration is configured to have the same gain material (and thus same gain peak in its emission spectra) but different reflection or loss profile to make the laser diode emitters emit light at different peak wavelengths. One way to tune the reflection profile could be realized through Bragg gratings with different designs, as shown.

As shown in FIG. 12, the example laser light source 201L includes a plurality of cavities filled with a gain material for each laser diode emitter 202C1-4. The cavities are resonant and defined by a highly reflective Distributed Bragg Reflection (DBR) mirror on one end and a different, low reflectivity exit grating 1200 for each of the plurality of laser diode emitters 202C1-C4 on another end. When current is injected to the cavities, each laser diode emitter 202C1-C4 emits light of a different, respective wavelength $\lambda_1$-$\lambda_4$ out of the exit grating. In one example configuration, this can result in a shift of the lasing wavelength or the effective gain peak by +/−5 nm. It will be appreciated that shifts of other magnitudes may also be implemented as desired.

Figure 13:
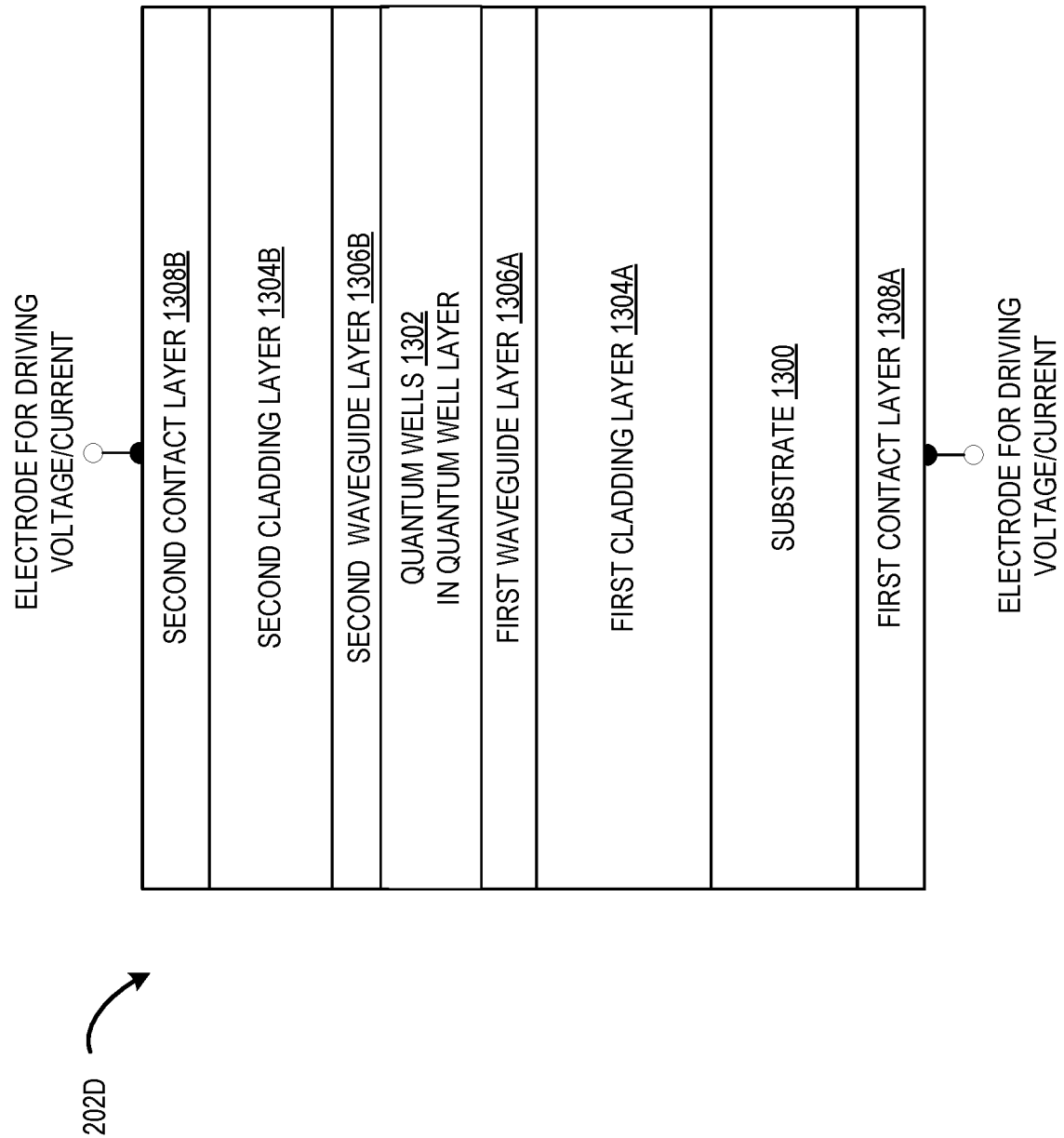
FIG. 13 is a cross-sectional side view of an example configuration of a laser diode emitter that may be used in the system of FIG. 1, having a plurality of layers deposited on a substrate.

Another configuration of the broad-spectrum laser diode emitter is shown at 202D in FIG. 13 and described below. As shown, the laser diode emitter 202D includes a substrate 1300. Substrate 1300 typically includes a first contact layer 1308A formed directly or indirectly on an underside thereof, to which an electrode for electrically coupling a driving or voltage source may be provided. The laser diode emitter 202D may further include a first cladding layer 1304A deposited directly or indirectly onto the substrate 1300, a first waveguide layer 1306A deposited directly or indirectly onto the first cladding layer 1304A, and a plurality of quantum wells 1302 formed in a quantum well layer. The plurality of quantum wells is depicted as including four quantum wells 1302; however, it will be appreciated that other suitable numbers of quantum well layers may be included.

Each of the quantum wells 1302 has a respective material composition to achieve a respective peak wavelength in emitted light when energized. The respective material composition of each quantum well 1302 is different. Because the material composition of the quantum wells 1302, along with factors such as thickness and strain, determines the peak wavelength of emitted light, each respective peak wavelength is different. Therefore, when the laser diode emitter 202D is energized, the plurality of quantum wells 1302 collectively lase emitted light having a broader bandwidth than is emitted by any individual quantum well 1302 of the plurality of quantum wells 1302, and the emitted light includes the plurality of respective peak wavelengths across an emitted light frequency spectrum. As used herein, "collectively lase" means lase as a group to emit a spectrum of light together as a group. Thus, while individual quantum wells 1302 within the laser diode emitter 202D may each have a respective narrow (e.g. 2 nm) peak bandwidth of emitted light, the peak bandwidth of emitted light of the laser diode emitter as a whole will be greater (e.g. 10 nm or more) than any of the individual quantum wells 1302 therein. The emitted light having a broader bandwidth is the result of superposition of waves of the emitted light from each individual quantum well 1302. In other words, each individual quantum well 1302 of the laser diode emitter 202D emits light with a respective peak wavelength and associated emission spectrum, and the emission spectrum of the laser diode emitter 202D is the sum of the emission spectra of the individual quantum wells 1302. Example spectra of individual quantum wells 1302 collectively lasing are provided in FIG. 14 and described in detail below.

Laser diode emitter 202D further includes a second waveguide layer 1306B deposited directly or indirectly onto the quantum well layers 1302 deposited directly or indirectly on the topmost quantum well 1302, a second cladding layer 1304B deposited directly or indirectly onto the second waveguide layer 1306B, and a second contact layer 1308 deposited directly or indirectly onto the second cladding layer 1304B. The second contact layer 1308 includes an electrode for coupling to the driving voltage or current source, similar to the first contact layer. The depicted layers, with the possible exception of the substrate, are formed by epitaxial growth of semiconducting materials and may be referred to collectively as epitaxial layers. Examples of semiconducting materials include GaAs, InAlGaP, GaN, AlGaN, and InGaN. However, it should be appreciated that other semiconducting materials may be used.

As described above, the material composition of the quantum wells 1302 determines the peak wavelength of the emitted light. In one example, the laser diode emitter 202D may be configured to emit red light, and the material composition may follow the formula: $In_x[Al_yGa_{1-y}]_{1-x}P$, where $0.4<x<0.6$ and $0<y<0.55$. It will be appreciated that in other aspects, the material composition may follow any suitable formula for a laser diode emitter emitting red light.

In another example, the laser diode emitter 202D may be configured to emit green light, and the material composition of the quantum wells 1302 may follow the formula: $In_xGa_{1-x}N$, where $0.26<x<0.4$. It will be appreciated that in other aspects, the material composition may follow any suitable formula for a laser diode emitter emitting green light.

In another example, the laser diode emitter 202D may be configured to emit blue light, and the material composition of the quantum wells 1302 may follow the formula: $In_xGa_{1-x}N$, where $0.15<x<0.25$. It will be appreciated that in other aspects, the material composition may follow any suitable formula for a laser diode emitter emitting blue light.

Figure 14:
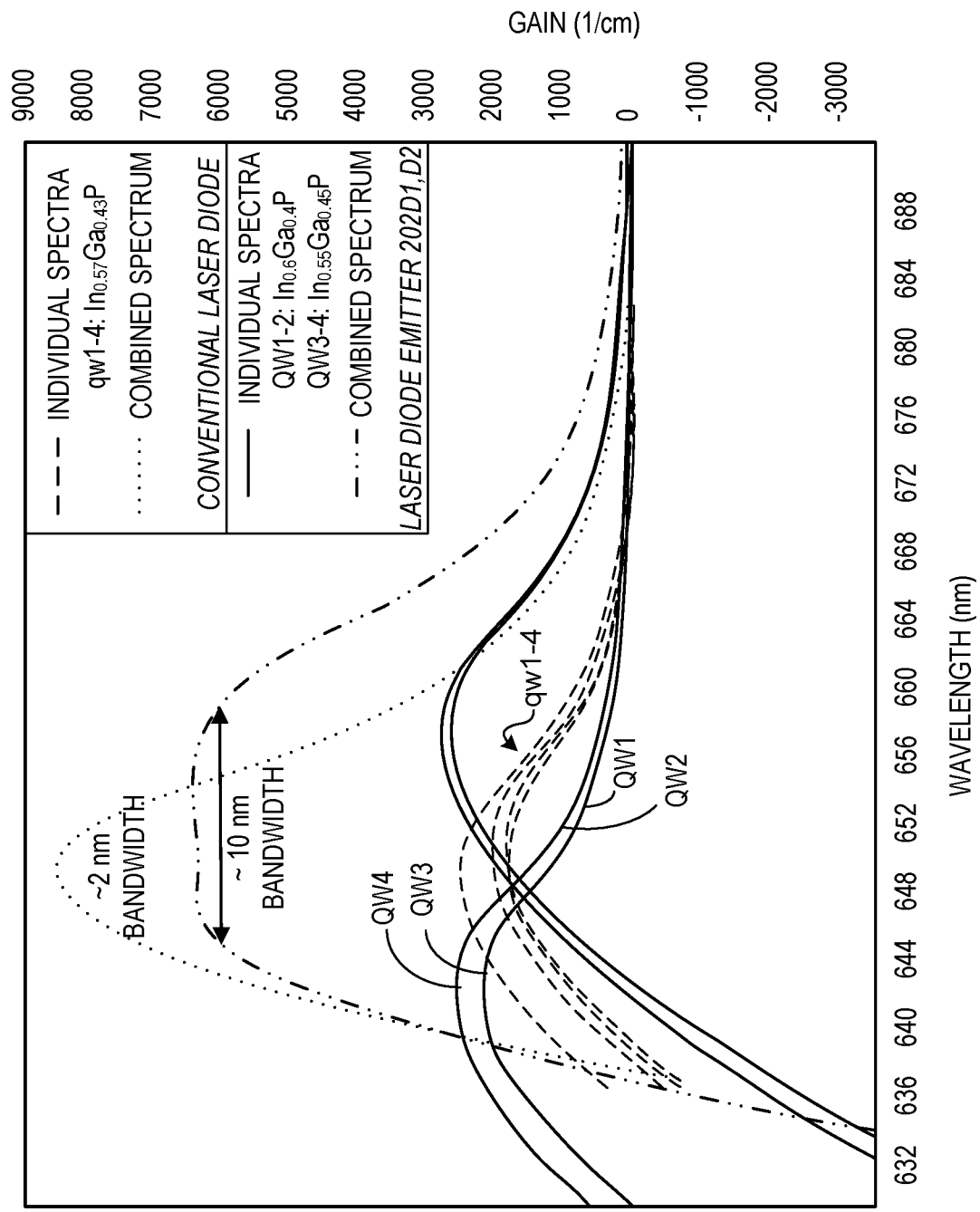
FIG. 14 illustrates emission spectra of a conventional laser diode emitter and of a laser diode emitter of the configuration shown in FIG. 13.

Turning now to FIG. 14, a simulated gain spectrum of a conventional laser diode emitter comprising four quantum wells of uniform composition is shown along with the simulated gain spectra of the four constituent quantum wells of the conventional laser diode emitter. Uniform quantum wells may be used to the provide potential benefit of a narrow bandwidth that may be suitable for laser applications. In this configuration, a narrow (ca. 2 nm) peak bandwidth is obtained.

FIG. 14 further illustrates plot of wavelength vs. gain for each of laser diode emitter 202D described above, and a conventional laser diode. The configuration of laser diode emitter 202D that has been graphed includes two quantum wells having a first material composition and two quantum wells having a second material composition that is different from the first. For each of the conventional laser diode and laser diode emitter 202D, an output of the individual quantum well spectra and a combined spectrum of lased light from all quantum wells has been plotted. As can be observed, the peak of the combined spectrum of the conventional laser is narrow (around 2 nm) whereas the peak of the combined spectrum of the laser diode emitter 202D has a broad (about 10 nm) peak bandwidth.

Figure 15:
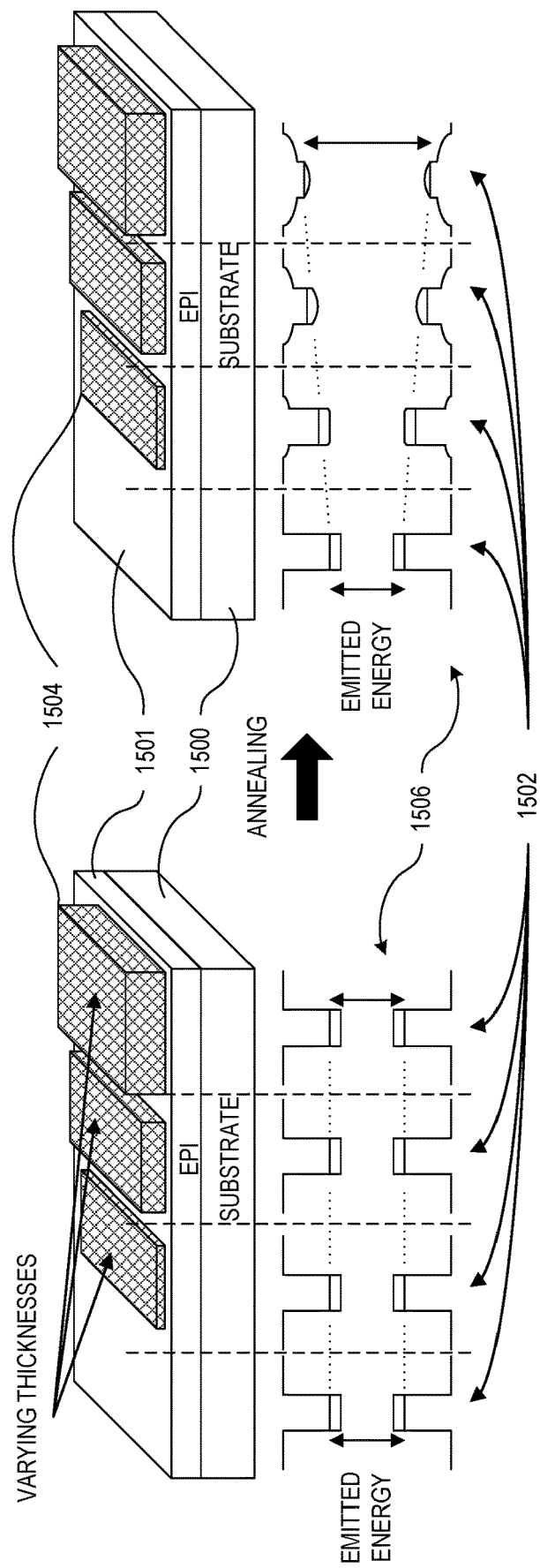
FIG. 15 is a schematic drawing showing modification of a laser diode stack through annealing with strain inducing layers deposited thereon, to manufacture the laser diode emitter of FIG. 13.
Figure 16:
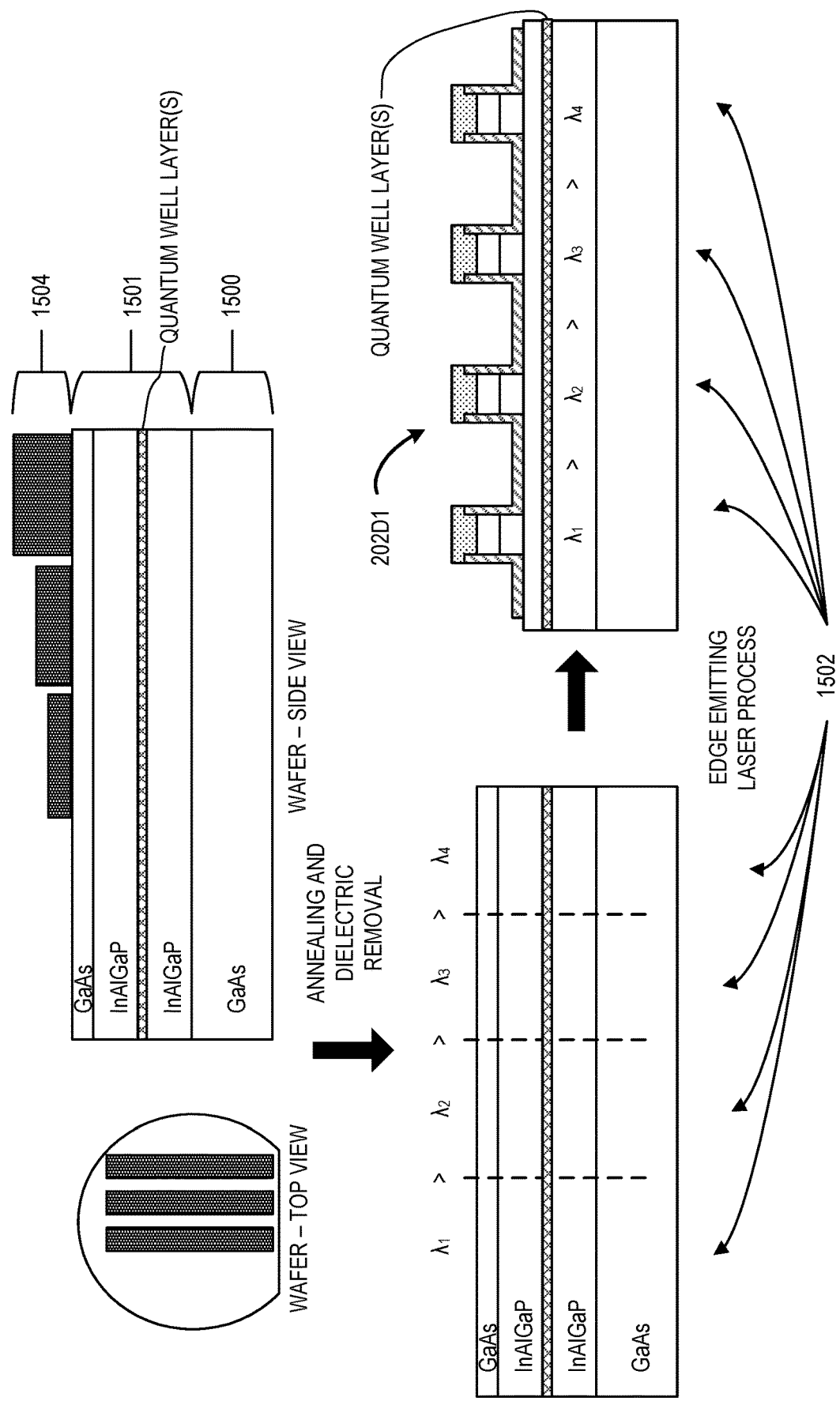
FIG. 16 illustrates a process flow for fabricating an example configuration of the laser diode emitter of FIG. 13.

Turning now to FIGS. 15 and 16, a method of manufacturing a laser diode emitter 202D1 according to another configuration of the present disclosure is illustrated. A wafer comprising a substrate 1500 and a plurality of epitaxial layers 1501 is shown. Epitaxial layers 1501 include a plurality of quantum wells that are organized in a plurality of quantum well layer sections 1502 (i.e., quantum well layer sections arranged along the horizontal axis in FIG. 15). In this configuration, the material composition of each of the quantum well layer sections 1502 in the plurality of quantum well layer sections 1502 includes an epitaxial structure, the epitaxial structure of each composition is substantially uniform across the wafer when deposited, and the quantum wells formed therein are intermixed through thermal interdiffusion with adjacent semiconductor layers to thereby achieve a different peak in the corresponding gain spectrum for each quantum well layer section 1502. As shown, epitaxial layers 1501 are uniformly deposited onto a substrate 1500 (top left of FIG. 15) and the resulting quantum well layer sections 1502 (bottom left of FIG. 15) are uniform and therefore would emit light of a same energy and peak wavelength without further processing, but the quantum well layer sections 1502 are further processed to have different peak wavelengths, as described below.

Further processing, with the goal of producing quantum well layer sections 1502 each emitting a different peak wavelength, may be achieved using the following techniques. Continuing with FIG. 15 at left, the emission spectrum of each quantum well layer section can be modified by application of a strain inducing thin film layer 1504 followed first by an annealing process and second by removal of the strain inducing thin film layer, both of which are described in more detail below. The right side of FIG. 15 illustrates the stack after annealing but prior to the removal of the strain inducing film layer 1504.

Although the use of a strain inducing thin film layer 1504 is described herein as a way to produce a wafer having quantum well layer sections 1502 each emitting a different peak wavelength due to different epitaxial structures, other suitable techniques may also be used. For example, one alternative technique is regrowth of a modified epitaxial structure at different sections of the wafer, either on native substrate 1500 or on etched sections of substrate 1500. Another alternative technique involves etching each of the quantum well layer sections 1502 before depositing additional layers by epitaxial growth.

Continuing with FIG. 15, the material for the strain inducing thin film layer 1504 is chosen such that the lattice constants of the strain inducing thin film layer 1504 are mismatched with those of the material on which the strain inducing thin film layer 1504 is deposited. In this configuration, the strain inducing thin film layer 1504 does not cover the entire surface on which it is deposited, but instead has a plurality of segments of varying thickness. In this configuration, the plurality of segments are separated by gaps of 3 µm, and each segment has a respective predetermined uniform thickness. In another configuration, the segments may be adjacent to one another without gaps, or gaps of another dimension may be provided. For example, in other configurations, the gaps may be 1, 2, 4, or 5 µm. In other configurations, the gaps may even be 100, 200, 300, 400, or 500 µm. Typically, a same number of quantum well layer sections 1502 and segments of thin film layer 1504 are provided. Annealing at a predetermined temperature serves to trigger diffusion and intermixing between each quantum well layer sections 1502 and regions of the semiconductor layers adjacent the quantum well layer sections 1502, as illustrated in FIG. 15 (bottom right) and FIG. 16. The different respective peak wavelengths of each quantum well layer section 1502 are due to quantum well intermixing by interdiffusion of constituent atoms between each of the quantum well layer sections 1502 in the quantum well layer and respective regions of the first and/or second semiconducting layers vertically adjacent the corresponding quantum well layer sections. It will be appreciated that each of the plurality of segments of the strain inducing layer 1504 was positioned before annealing and prior to removal above a corresponding one of the plurality of quantum well layer sections 1502, to thereby vary the interdiffusion within each quantum well layer section based on the respective thickness of the corresponding segment positioned above each quantum well layer section. Removal of the strain inducing thin film layer 1504 results in the plurality of quantum well layer sections 1502 being spatially distributed horizontally and parallel to a horizontal plane defined by the substrate 1500, each section 1502 having varied diffusion therewithin, and each section 1502 being configured by this varied diffusion to lase at a different corresponding peak wavelength.

Energy states of the pre-annealing quantum well and post-annealing intermixed quantum well layer sections 1502 are depicted in energy graph 1506 of idealized quantum well structure sections 1502 at bottom of FIG. 15. As shown, at left in energy graph 1506, the energy function is depicted as having sharp corners and being the same for each quantum well layer section 1502. As depicted at right, the energy function is shown to be gradually less sharp cornered from left to right, which has the effect of shifting the emitted energy profile in a gradually more pronounced manner from left to right FIG. 15.

FIG. 16 provides a continuing illustration of the manufacturing process for the laser diode emitter 202D1, which will now be described. A top view (top left of FIG. 16) and side view (top right of FIG. 16) of the wafer that will be used to manufacture laser diode emitter 202D1 includes the substrate 1500, epitaxial layers 1501 and quantum well layers 1502, and the plurality of segments of strain inducing thin film layer 1504. The wafer undergoes annealing at a temperature and duration sufficient to trigger diffusion and intermixing of the quantum well layer sections 1502 and the layers adjacent the quantum well layer sections 1502. Diffusion and intermixing during annealing may be the result of differing thermal expansion coefficients of the strain inducing thin film layer 1504 and the layers on which it is deposited. During annealing, the differing thermal expansion causes increased strain resulting in defects between the quantum well layers and the layers adjacent the quantum well layers. At annealing temperatures, the defects allow diffusion of atoms between the quantum well layers and the semiconductor layers adjacent the quantum well layers. In this example, the annealing temperature is between 800° C. and 1000° C., for example about 950 degrees, and the annealing duration is 30 to 150 seconds, however other annealing temperatures and annealing durations may be used.

The thickness of the segments of strain inducing thin film layer segments 1504 is proportional to the change in peak wavelength emitted by the respective quantum well layer sections 1502 (top right and bottom left of FIG. 16). Although in FIG. 16, three segments of strain inducing thin film are used resulting in four peak wavelengths of emitted light, it will be appreciated that any suitable number of segments of strain inducing thin film may be used. For example, two, four, or five segments of strain inducing thin film may be used resulting in three, five, or six peak wavelengths of emitted light respectively. The three segments of strain inducing thin film depicted in FIG. 16 are each of a different thickness, and may be 200 nm, 400 nm, and 600 nm respectively, although any thickness capable of inducing a change diffusion of atoms during quantum well intermixing at annealing temperatures in the underlying quantum well sections may be used. In other examples two or more of the segments of strain inducing thin film layer 1504 may be of the same thickness. The strain inducing thin film layer 1504 may be a dielectric material and in this example is $SiO_2$, however $Si_3N_4$, $SiO_x$, $SrF_2$, $Mo/SiO_2$, or any other suitable material or combinations of materials may also be used.

Another embodiment of the broad-spectrum laser diode emitter is shown in FIG. 17 at 202D2 and described below. As shown, laser diode emitter 202D2 may have a substrate 1700, and a plurality of quantum wells 1702. The quantum wells 1702 are non-uniform, each having a narrow gain bandwidth centered at different respective wavelengths, the overall effect being a laser diode emitter 202D2 with a broader peak gain bandwidth.

Like the embodiments described above, laser diode emitter 202D2 also provides methods and device configurations for the formation of semiconductor laser diode emitters operating in the visible regime that have a broad emission spectrum. These laser diode emitters, coupled with SRG waveguides, may provide an improved image quality by mitigating potential image artifacts such as fringe artifacts and color uniformity artifact in MEMS laser scanning display devices 200, as described above. The approach, detailed below, modifies the emission wavelengths of the multiple emitting layers and generates a broad gain spectrum.

As discussed elsewhere above, laser diode emitters 202F consist of multiple thin films grown epitaxially on a substrate material, such as GaAs for red laser diode emitters or GaN for green or blue laser diode emitters, as shown schematically in FIG. 17. These devices rely on engineering positive "p-type", and negative "n-type", regions of material that come into contact to allow opposite electrical charges collide and generate light. The light generation occurs most efficiently inside energetically confined region known as quantum wells 1702, which also determine the photons wavelength. Typically, laser diode emitters consist of multiple quantum wells 1702 and the desired emission wavelength is chosen by engineering the composition, thickness, and strain conditions of the multiple quantum wells 1702. That is, by changing the indium content in the $In_xGa_{1-x}P$ alloy for red emitting laser diode emitters or in the $In_xGa_{1-x}N$ alloy for blue or green emitting laser diode emitters. Note that the quantum wells' alloy can be generally composed of (InAlGa)P alloy for red lasers or (InAlGa)N alloy for blue and green lasers. As an example, typical blue emitting quantum wells 1702 can have $In_{0.18}Ga_{0.82}N$ alloy, green emitting QWs can have $In_{0.3}Ga_{0.7}N$ alloy, and red emitting QWs can have $In_{0.55}Ga_{0.45}P$ alloy.

In conventional laser diode emitters, where a narrow spectral width has been suitable for many laser applications, uniform MQWs design may be desired. These designs generate light around a center wavelength as demonstrated in FIG. 14, which shows the simulated gain spectrum of a LD that contains four uniform $In_{0.57}Ga_{0.43}P$ MQWs. The result is a peak gain bandwidth of ~2 nm.

The approach for the example laser diode emitter of FIG. 17 includes growing non-uniform multiple quantum wells 1702 to broaden the emission spectrum of the laser diode emitter 202F. A plot of the gain vs. wavelength for an example configuration of the laser diode emitter 202D2 of FIG. 17 is shown in FIG. 14, previously discussed. In FIG. 14. laser diode emitter 202D2 is plotted with a configuration of two quantum wells with an indium composition of $In_{0.6}Ga_{0.4}P$ have a peak gain at ~658 nm and another two quantum wells with an indium composition of $In_{0.55}Ga_{0.45}P$ have a peak gain at ~642 nm, which result in a peak gain bandwidth of ~10 nm. Other alternative implementations may include changing the total number of quantum wells, the number quantum wells emitting at each wavelength, the quantum wells thicknesses, or the strain conditions of the quantum wells. For instance, another implementation is a laser diode emitter with three quantum wells emitting at one wavelength and another quantum wells at a different wavelength, and so forth.

As one parameter to vary the emission wavelength of these laser diode emitters is the indium composition in the multiple quantum wells, the approach described above may be extended to the entire visible range. The composition may be varied by changing the growth temperature of the $In_xGa_{1-x}N$ or $In_xGa_{1-x}P$ alloy or the indium flow rate during the quantum wells' epitaxial growth.

Turning back to FIG. 17, laser diode emitter 202 includes a substrate 1700 and a plurality of quantum wells 1702 formed in a quantum well layer that is formed directly or indirectly on the substrate 1700. The substrate 1700 defines a horizontal plane wherein each of the plurality of quantum wells 1702 is positioned at a different respective vertical displacement relative to the substrate 1702. The relative displacements may vary in magnitude based on the thicknesses of quantum wells 1702 and of other layers in the laser diode emitter 202D2. The plurality of quantum wells 1702 overlap each other as viewed from above along a vertical axis V AXIS passing through each of the plurality of quantum wells 1702. Each of the quantum wells 1702 has a different composition to achieve a different peak wavelength in emitted light when energized. When the laser diode emitter 202D2 is energized, the plurality of quantum wells 1702 collectively lase emitted light having a broader bandwidth than is emitted by a single quantum well. The emitted light has a plurality of different peak wavelengths in an emitted light spectrum, as shown in FIG. 14.

In the plurality of quantum wells 1702, two or more wells 1702 may be included. As depicted, four quantum wells 1702 are included. In other embodiments, two, three, or other greater number of wells may be included.

In the depicted embodiment, as shown in FIG. 14, quantum wells 3 and 4 emit a similar spectrum which is different from quantum wells 1 and 2. It will be appreciated that in other embodiments, each of the at least four quantum wells may emits a different peak wavelength of light.

Returning to FIG. 17, the quantum wells 1702 may be formed by a material, such as, for example, indium gallium nitride, or indium aluminum gallium phosphide. In one example, the material of the quantum wells follows one of the following formulas: $In_x[Al_yGa_{1-y}]_{1-x}P$ and $In_xGa_{1-x}N$. The substrate 1702 may be formed by a material, such as, for example, gallium arsenide and gallium nitride. For example, the emitted light spectrum may be blue, the substrate may be gallium nitride, and the material for the quantum wells may be indium gallium nitride. In one specific example, the indium gallium nitride is $In_xGa_{1-x}N$, where $0.15<x<0.25$. In another example configuration, the emitted light spectrum may be green, the substrate may be gallium nitride, and the material for the quantum wells may be indium gallium nitride. More specifically, the indium gallium nitride may be $In_xGa_{1-x}N$, where $0.26<x<0.4$. In another example, the emitted light spectrum may be red, the substrate may be 1700 may be gallium arsenide, and the material for the quantum wells 1702 may be indium aluminum gallium phosphide. In this example, specifically the indium aluminum gallium phosphide may be $In_x[Al_yGa_{1-y}]_{1-x}P$, where $0.4<x<0.6$ and $0<y<0.55$.

In one specific configuration, the plurality of quantum wells 1702 may include at least three quantum wells 1702, and at least two quantum wells 1702 of the plurality of quantum wells 1702 may be configured to emit light at a same peak wavelength and at least one of the plurality of quantum wells 1702 may be configured to emit light at a different peak wavelength from the same peak wavelength.

It should be appreciated that the quantum wells 1702 may be formed by epitaxial growth of $In_xGa_{1-x}N$ or $In_x[Al_yGa_{1-y}]_{1-x}P$ alloy, and the composition of the quantum wells 1702 may be varied by changing a growth temperature of $In_xGa_{1-x}N$ or $In_x[Al_yGa_{1-y}]_{1-x}P$ alloy or an indium flow rate during the epitaxial growth.

Figure 21:
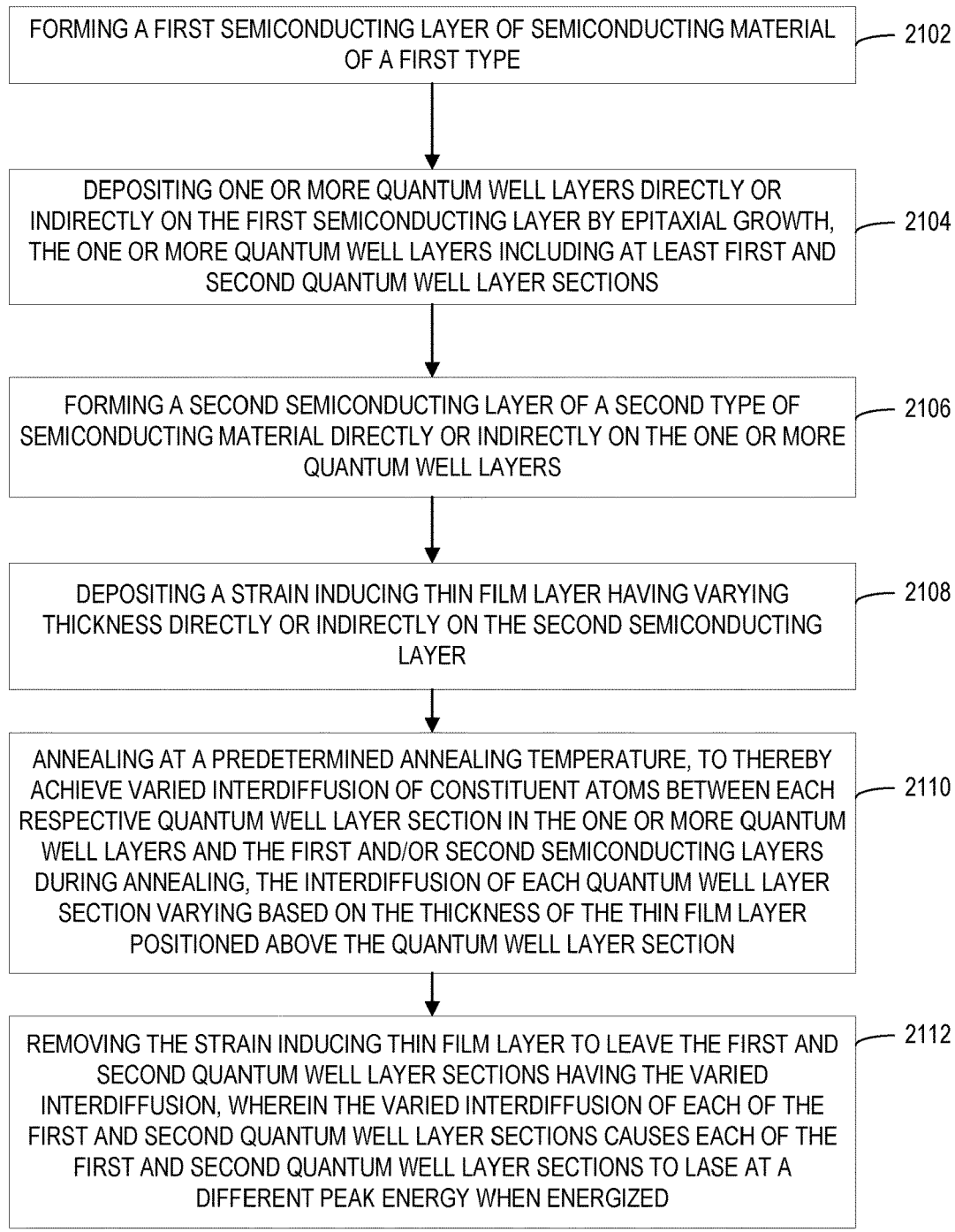
FIG. 21 illustrates a flowchart of a method, according to one embodiment of the present disclosure.
Figure 22:
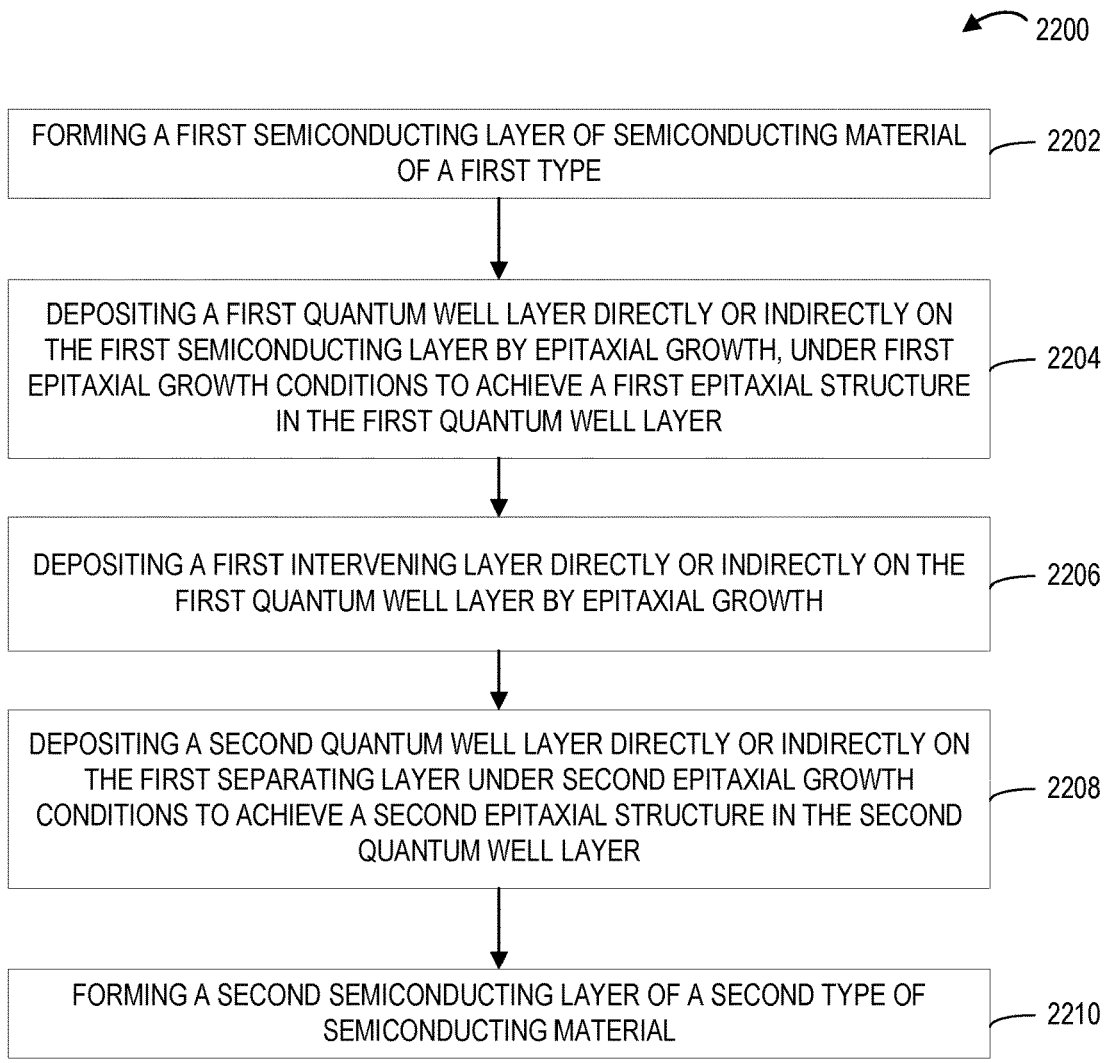
FIG. 22 illustrates a flowchart of a method, according to another embodiment of the present disclosure.

Turning now to FIG. 21, a method 2100 for producing a laser diode stack for use in a laser diode emitter 202 according to one embodiment of the present disclosure will now be described. A method 2100 for producing a laser diode stack for use in a laser diode emitter, is provided. As illustrated at 2102, the method in one embodiment comprises forming a first semiconducting layer of semiconducting material of a first type in the laser diode stack. At 2104, the method further comprises depositing one or more quantum well layers directly or indirectly on the first semiconducting layer by epitaxial growth in the laser diode stack, the one or more quantum well layers including at least first and second quantum well layer sections. At 2106, the method further comprises forming a second semiconducting layer of a second type of semiconducting material in the laser diode stack directly or indirectly on the one or more quantum well layers. At 2108, the method further comprises depositing a strain inducing thin film layer having varying thickness along the horizontal direction of the wafer directly or indirectly on the second semiconducting layer of the laser diode stack. At 2110, the method further comprises annealing the laser diode stack and strain inducing thin film layer at a predetermined annealing temperature, to thereby achieve varied interdiffusion of constituent atoms between each respective the quantum well layer section 1502 in the quantum well layer and the first and/or second semiconducting layers during annealing, the interdiffusion of each quantum well layer section 1502 varying based in part on the thickness of the thin film layer positioned above the quantum well layer section 1502. At 2112, the method further comprises removing the strain inducing thin film layer to leave the sections under the varying thin film thickness having the varied interdiffusion, wherein the varied interdiffusion of each of the quantum well layer sections under the varying thin film thickness causes each of the quantum well layer sections under the varying thin film thickness to lase at a different peak energy when energized.

In one aspect, the method further comprises depositing by epitaxial growth, one or more cladding layers and/or a waveguide layer between the first semiconductor layer and the quantum well layer.

In another aspect, the method further comprises depositing by epitaxial growth, one or more cladding layers and/or a waveguide layer between the quantum well layer and the second semiconducting layer.

In another aspect, the first type of semiconducting material is an n-type material, and the second type of semiconducting material is a p-type material.

In another aspect, the first type of semiconducting material is a p-type material, and the second type of semiconducting material is an n-type material.

Turning now to FIG. 19, a method 2200 for producing a laser diode stack for use in a laser diode emitter according to one embodiment of the present disclosure will now be described.

A method 2200 for producing a laser diode stack for use in a laser diode emitter is provided. As illustrated at 2202, the method in one embodiment comprises forming a first semiconducting layer of semiconducting material of a first type in the laser diode stack. At 2204, the method further comprises, depositing a first quantum well layer directly or indirectly on the first semiconducting layer by epitaxial growth in the laser diode stack, under first epitaxial growth conditions to achieve a first epitaxial structure in the first quantum well layer. At 2206, the method further comprises, depositing a first intervening layer directly or indirectly on the first quantum well layer by epitaxial growth in the laser diode stack. At 2208, the method further comprises, depositing a second quantum well layer directly or indirectly on the first separating layer by epitaxial growth in the laser diode stack under second epitaxial growth conditions to achieve a second epitaxial structure in the second quantum well layer. At 2210, the method further comprises, forming a second semiconducting layer of a second type of semiconducting material in the laser diode stack. For blue or green laser emitters, both the first quantum well layer and second quantum well layer include $In_xGa_{1-x}N$. For red laser emitters, both the first quantum well layer and the second quantum well layer include $In_x[Al_yGa_{1-y}]_{1-x}P$.

In one aspect, growth of each of the first quantum well layer and the second quantum well layer is varied by altering epitaxial growth conditions of the respective first and second quantum well layers to thereby cause each of the first and second quantum well layers to lase at a different peak energy when energized.

In another aspect, the first epitaxial structure and the second epitaxial structure are varied by changing a growth temperature of $In_xGa_{1-x}N$ at which each of the first and second quantum well layers is grown.

In another aspect, the first epitaxial structure and the second epitaxial structure are varied by changing a growth temperature of $In_x[Al_yGa_{1-y}]_{1-x}P$ at which each of the first and second quantum well layers is grown.

In another aspect, the first epitaxial structure and the second epitaxial structure are varied by changing an indium flow rate during the epitaxial growth of the first quantum well layer and the second quantum well layer.

Turning now to FIG. 23, a method 2300 for modulating drive current for a tunable absorber section to sweep through a range of values according to one embodiment of the present disclosure will now be described.

As illustrated at 2302, the method in one embodiment comprises supplying, via a first current or voltage source, a first drive current or voltage to a gain section coupled with the first current or voltage source. At 2304, the method further comprises supplying, via a second current or voltage source, a second drive current or voltage to a tunable absorber section coupled with the second current or voltage source, wherein the gain section and the tunable absorber section are included in a laser diode emitter for use in a micro electro-mechanical system (MEMS) laser scanning display device, this can also be used in applications other than MEMS based displays where a broad bandwidth laser diode is needed. At 2306, the method further comprises modulating the second drive current or voltage to sweep through a range of values over a period of time to cause a shifting of a wavelength of the laser diode emitter at which an overall gain is at maximum, to thereby cause the laser diode emitter to emit spectrally broadened light.

In one aspect, at least a portion of the gain section is electrically isolated from at least a portion of the tunable absorber section.

In another aspect, a first electrode coupling the gain section to the first current or voltage source is separated from a second electrode coupling the tunable absorber section to the second current or voltage source.

In another aspect, the second current or voltage source is configured to sweep through the range of values over a period of time between 2 nanoseconds and 20 nanoseconds.

In another aspect, an absorption edge inside the tunable absorber section is shifted by up to 20 nanometers over the range of values supplied by the second current or voltage source.

In another aspect, at least a quantum well layer extends through each of the gain section and the tunable absorber section.

In another aspect, the gain section is configured to have a flattened gain spectrum.

As an alternative to method 2300, it will be appreciated that the first and second drive currents or voltages may be driven similarly with the same source, rather than different current or voltage sources. In this case a structure such as shown in FIG. 6 acts similarly to a laser diode emitter with no chirper. However, with a broad and flattened gain spectrum provided for example by the various laser diode emitter structures described herein, some examples of which are illustrated in FIG. 17-20C, a broadened lasing spectrum may be obtained even when the first and second drive currents or voltages are driven similarly with the same source.

It will be appreciated that the systems and methods described above may be employed to achieve a laser diode emitter having a broadened spectrum of emitted light, which may be incorporated into a laser scanning display device 200 of a near eye display system 100, with the beneficial effect of reducing artifacts and improving the color uniformity of the image displayed to a user of such devices.

In some embodiments, the methods and processes described herein may be tied to a computing system of one or more computing devices. In particular, such methods and processes may be implemented as a computer-application program or service, an application-programming interface (API), a library, and/or other computer-program product.

Figure 24:
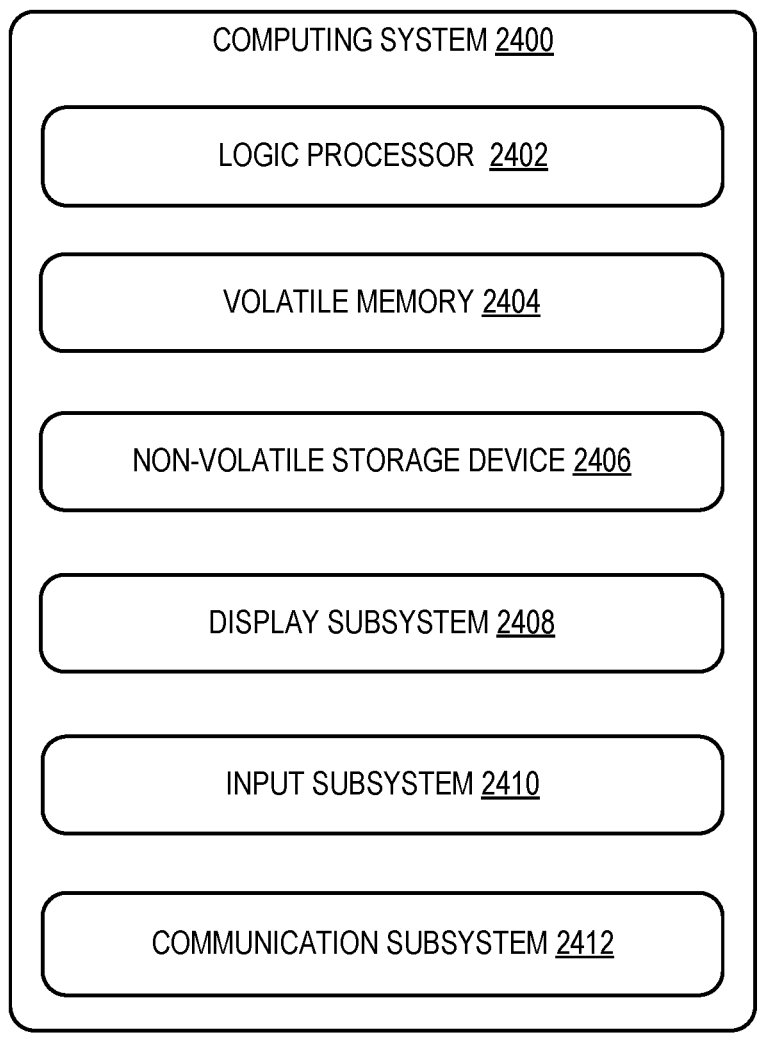
FIG. 24 shows a schematic view of an example computing environment according to which the near-eye display system of FIG. 1 may be implemented.

FIG. 24 schematically shows a non-limiting embodiment of a computing system 2400 that can enact one or more of the methods and processes described above. Computing system 2400 is shown in simplified form. Computing system 2400 may embody the near-eye display system of FIG. 1 and laser scanning display device 200 of FIG. 2, described above. Computing system 2400 may take the form of one or more personal computers, server computers, tablet computers, home-entertainment computers, network computing devices, gaming devices, mobile computing devices, mobile communication devices (e.g., smart phone), and/or other computing devices, and wearable computing devices such as smart wristwatches and head mounted augmented reality devices.

Computing system 2400 includes a logic processor 2402 volatile memory 2404, and a non-volatile storage device 2406. Computing system 2400 may optionally include a display subsystem 2408, input subsystem 2410, communication subsystem 2412, and/or other components not shown in FIG. 24.

Logic processor 2402 includes one or more physical devices configured to execute instructions. For example, the logic processor may be configured to execute instructions that are part of one or more applications, programs, routines, libraries, objects, components, data structures, or other logical constructs. Such instructions may be implemented to perform a task, implement a data type, transform the state of one or more components, achieve a technical effect, or otherwise arrive at a desired result.

The logic processor may include one or more physical processors (hardware) configured to execute software instructions. Additionally or alternatively, the logic processor may include one or more hardware logic circuits or firmware devices configured to execute hardware-implemented logic or firmware instructions. Processors of the logic processor 2402 may be single-core or multi-core, and the instructions executed thereon may be configured for sequential, parallel, and/or distributed processing. Individual components of the logic processor optionally may be distributed among two or more separate devices, which may be remotely located and/or configured for coordinated processing. Aspects of the logic processor may be virtualized and executed by remotely accessible, networked computing devices configured in a cloud-computing configuration. In such a case, these virtualized aspects are run on different physical logic processors of various different machines, it will be understood.

Non-volatile storage device 2406 includes one or more physical devices configured to hold instructions executable by the logic processors to implement the methods and processes described herein. When such methods and processes are implemented, the state of non-volatile storage device 2406 may be transformed—e.g., to hold different data.

Non-volatile storage device 2406 may include physical devices that are removable and/or built in. Non-volatile storage device 2406 may include optical memory (e.g., CD, DVD, HD-DVD, Blu-Ray Disc, etc.), semiconductor memory (e.g., ROM, EPROM, EEPROM, FLASH memory, etc.), and/or magnetic memory (e.g., hard-disk drive, floppy-disk drive, tape drive, MRAM, etc.), or other mass storage device technology. Non-volatile storage device 2406 may include nonvolatile, dynamic, static, read/write, read-only, sequential-access, location-addressable, file-addressable, and/or content-addressable devices. It will be appreciated that non-volatile storage device 2406 is configured to hold instructions even when power is cut to the non-volatile storage device 2406.

Volatile memory 2404 may include physical devices that include random access memory. Volatile memory 2404 is typically utilized by logic processor 2402 to temporarily store information during processing of software instructions. It will be appreciated that volatile memory 2404 typically does not continue to store instructions when power is cut to the volatile memory 2404.

Aspects of logic processor 2402, volatile memory 2404, and non-volatile storage device 2406 may be integrated together into one or more hardware-logic components. Such hardware-logic components may include field-programmable gate arrays (FPGAs), program- and application-specific integrated circuits (PASIC/ASICs), program- and application-specific standard products (PSSP/ASSPs), system-on-a-chip (SOC), and complex programmable logic devices (CPLDs), for example.

The terms "module," "program," and "engine" may be used to describe an aspect of computing system 2400 typically implemented in software by a processor to perform a particular function using portions of volatile memory, which function involves transformative processing that specially configures the processor to perform the function. Thus, a module, program, or engine may be instantiated via logic processor 2402 executing instructions held by non-volatile storage device 2406, using portions of volatile memory 2404. It will be understood that different modules, programs, and/or engines may be instantiated from the same application, service, code block, object, library, routine, API, function, etc. Likewise, the same module, program, and/or engine may be instantiated by different applications, services, code blocks, objects, routines, APIs, functions, etc. The terms "module," "program," and "engine" may encompass individual or groups of executable files, data files, libraries, drivers, scripts, database records, etc.

When included, display subsystem 2408 may be used to present a visual representation of data held by non-volatile storage device 2406. The visual representation may take the form of a graphical user interface (GUI). As the herein described methods and processes change the data held by the non-volatile storage device, and thus transform the state of the non-volatile storage device, the state of display subsystem 2408 may likewise be transformed to visually represent changes in the underlying data. Display subsystem 2408 may include one or more display devices utilizing virtually any type of technology. Such display devices may be combined with logic processor 2402, volatile memory 2404, and/or non-volatile storage device 2406 in a shared enclosure, or such display devices may be peripheral display devices.

When included, input subsystem 2410 may comprise or interface with one or more user-input devices such as a keyboard, mouse, touch screen, or game controller. In some embodiments, the input subsystem may comprise or interface with selected natural user input (NUI) componentry. Such componentry may be integrated or peripheral, and the transduction and/or processing of input actions may be handled on- or off-board. Example NUI componentry may include a microphone for speech and/or voice recognition; an infrared, color, stereoscopic, and/or depth camera for machine vision and/or gesture recognition; a head tracker, eye tracker, accelerometer, and/or gyroscope for motion detection and/or intent recognition; as well as electric-field sensing componentry for assessing brain activity; and/or any other suitable sensor.

When included, communication subsystem 2412 may be configured to communicatively couple various computing devices described herein with each other, and with other devices. Communication subsystem 2412 may include wired and/or wireless communication devices compatible with one or more different communication protocols. As non-limiting examples, the communication subsystem may be configured for communication via a wireless telephone network, or a wired or wireless local- or wide-area network, such as a HDMI over Wi-Fi connection. In some embodiments, the communication subsystem may allow computing system 2400 to send and/or receive messages to and/or from other devices via a network such as the Internet.

The following paragraphs provide additional description of the subject matter of the present disclosure. According to one aspect, a laser diode emitter for use in a micro electro-mechanical system (MEMS) laser scanning display device is provided that comprises a gain section coupled with a first current or voltage source, and a tunable absorber section coupled with a second current or voltage source, wherein the second current or voltage source is configured to supply a drive current or voltage that sweeps through a range of values over a period of time to cause a shifting of a wavelength of the laser diode emitter at which an overall gain is at maximum, to thereby cause the laser diode emitter to emit spectrally broadened light.

In this aspect, at least a portion of the gain section may be electrically isolated from at least a portion of the tunable absorber section.

In this aspect, a first electrode coupling the gain section to the first current or voltage source may be separated from a second electrode coupling the tunable absorber section to the second current or voltage source.

In this aspect, the second current or voltage source may be configured to sweep through the range of values over a period of time between 2 nanoseconds and 20 nanoseconds.

In this aspect, an absorption edge inside the tunable absorber section may be shifted by 1 nanometer to 20 nanometers over the range of values supplied by the second current or voltage source.

In this aspect, at least a quantum well layer may extend through each of the gain section and the tunable absorber section.

In this aspect, the gain section may be configured to have a flattened gain spectrum.

According to another aspect, a method is provided that comprises supplying, via a first current or voltage source, a first drive current or voltage to a gain section coupled with the first current or voltage source, supplying, via a second current or voltage source, a second drive current or voltage to a tunable absorber section coupled with the second current or voltage source. The gain section and the tunable absorber section may be included in a laser diode emitter for user in a micro electro-mechanical system (MEMS) laser scanning display device.

In this aspect, at least a portion of the gain section may be electrically isolated from at least a portion of the tunable absorber section.

In this aspect, a first electrode coupling the gain section to the first current or voltage source may be separated from a second electrode coupling the tunable absorber section to the second current or voltage source.

In this aspect, the second current or voltage source may be configured to sweep through the range of values over a period of time between 2 nanoseconds and 20 nanoseconds.

In this aspect, an absorption edge inside the tunable absorber section may be shifted by up to 20 nanometers over the range of values supplied by the second current or voltage source.

In this aspect, at least a quantum well layer may extend through each of the gain section and the tunable absorber section.

In this aspect, the gain section may be configured to have a flattened gain spectrum achieved by a structure selected from the group consisting of different vicinal angles along a waveguide of the laser diode emitter, quantum well intermixing in the quantum well layer along the waveguide, quantum well sections with different composition, thickness, and/or strain in the quantum well layer, and a patterned substrate prior to epitaxial growth along the waveguide of the laser diode emitter.

According to another aspect, a micro electro-mechanical system (MEMS) laser scanning display device is provided that comprises a display. The MEMS laser scanning display device may further comprise a laser light source including an emitter array including a plurality of laser diode emitters, each laser diode emitter being configured to emit a respective different wavelength of light, to thereby form a broadband light beam with a broadband emission spectrum, wherein the broadband light beam has an emission spectra that includes a plurality of peaks. The MEMS laser scanning display device may further comprise a MEMS scanning mirror configured to guide the light beam, via a wave guide with an in-coupling grating and out-coupling grating, to achieve a scanning pattern across the display and thereby form a displayed image.

In this aspect, as compared to a laser light source that emits a light beam with an emission spectrum having a single peak, the broadband light beam may increase color uniformity in the displayed image by having a larger range of wavelengths in the laser light source, which results in a larger range of diffraction angles at the in-coupling grating and out-coupling grating, which in turn causes a smoother spatial variation of the grating efficiency as well as an increased spatial overlap of the out-coupled light.

In this aspect, the laser light source may include a substrate having a plurality of deposition regions on a top surface thereof, each deposition region having a different surface normal formed at orthogonally relative to a surface of the deposition region and at an angle relative to a planar bottom surface of the substrate, and each laser diode emitter may include a semiconductor material deposited on each of the deposition regions with surface normals of different angles in semiconductor regions, the semiconductor region of each emitter being configured to emit a respective different wavelength of light, to thereby form the light beam with a broadband emission spectrum with the plurality of peaks.

In this aspect, the semiconductor material may be InGaN and indium incorporation, quantum well thickness, and/or strain in each of the deposition regions may vary due to different vicinal angles in each deposition region, and the varying incorporation of indium in each of the deposition regions causes variation in the wavelengths of each diode emitter.

In this aspect, the laser light source may further include a plurality of cavities filled with a gain material for each laser diode emitter, cavities being resonant, and defined by a distributed Bragg reflection mirror on one end and an exit grating for each of the plurality of laser diode emitters on another end, such that when current is injected to the cavities, each laser diode emitter emits light of a different, respective wavelength.

In this aspect, the impinging light on each of the gratings may have a same wavelength spectrum.

According to another aspect, a laser diode emitter array is provided comprising a substrate and a first semiconductor layer deposited directly or indirectly on the substrate. The laser diode emitter array may further comprise a plurality of quantum well layer sections in a quantum well layer deposited directly or indirectly on the first semiconductor layer and having a substantially uniform epitaxial structure, each of the quantum well layer sections having a respective peak wavelength in emitted light when energized, each respective peak wavelength being different. The laser diode emitter array may further comprise a second semiconductor layer deposited directly or indirectly on the quantum well layer, wherein when the laser diode emitter array is energized, the plurality of quantum well layer sections collectively lase emitted light having a broader bandwidth than is emitted by any individual quantum well layer section of the plurality of quantum well layer sections, and the emitted light includes the plurality of respective peak wavelengths across an emitted light frequency spectrum.

In this aspect, the different respective peak wavelengths of each quantum well layer section may be due to quantum well intermixing by interdiffusion of constituent atoms between each quantum well layer section in the quantum well layer and the first and/or second semiconducting layers.

In this aspect, the interdiffusion may be a thermal interdiffusion that has been achieved at least in part by application of a strain inducing thin film layer having a plurality of segments of varying thickness, annealing at a predetermined temperature, and removal of the strain inducing thin film layer.

In this aspect, the substrate may define a horizontal plane, and the plurality of quantum well layer sections may be spatially distributed horizontally and parallel to the plane.

In this aspect, each of the plurality of segments of the strain inducing layer may have been positioned before annealing and prior to removal above a corresponding one of the plurality of quantum well layer sections, to thereby vary the interdiffusion within each quantum well layer section based on the respective thickness of the corresponding segment positioned above each quantum well layer section.

In another aspect, a laser diode emitter is provided comprising a substrate, a first semiconductor layer deposited directly or indirectly on the substrate. The laser diode emitter may further comprise a plurality of quantum well layers, each of the quantum well layers having a respective material composition to achieve a respective peak wavelength in emitted light when energized, each respective peak wavelength being different. The laser diode emitter may further comprise a second semiconductor layer deposited directly or indirectly on a topmost one of the quantum well layers, and when the laser diode emitter is energized, the plurality of quantum well layers collectively lase emitted light having a broader bandwidth than is emitted by any individual quantum well layer of the plurality of quantum well layers, and the emitted light includes the plurality of respective peak wavelengths across an emitted light frequency spectrum.

In this aspect, each respective material composition of the quantum well layers may follow the formula: $In_x[Al_y Ga_{1-y}]_{1-x}P$, where $0.4<x<0.6$ and $0<y<0.55$.

In this aspect, each respective material composition of the quantum well layers may follow the formula: $In_xGa_{1-x}N$, where $0.26<x<0.4$.

In this aspect, each respective material composition of the quantum well layers may follow the formula: $In_xGa_{1-x}N$, where $0.15<x<0.25$.

In this aspect, the substrate may define a horizontal plane and each of the plurality of quantum wells may be positioned at a different respective vertical displacement relative to the substrate, and the plurality of quantum wells may overlap each other as viewed from above along a vertical axis passing through each of the plurality of quantum wells, wherein growth of each of the plurality of quantum well layers is varied by altering epitaxial growth conditions of the respective plurality of quantum well layers to thereby cause each of the plurality of quantum well layers to lase at a different peak energy when energized.

In another aspect, a method for use in manufacturing a laser diode emitter is provide comprising forming a substrate, forming a first semiconducting layer of semiconducting material of a first type directly or indirectly on the substrate, depositing a quantum well layer directly or indirectly on the first semiconducting layer by epitaxial growth, the quantum well layer including at least first and second quantum well layer sections, forming a second semiconducting layer of a second type of semiconducting material directly or indirectly on the quantum well layer, depositing a strain inducing thin film layer having varying thickness directly or indirectly on the second semiconducting layer. The method may further comprise annealing the substrate, first semiconductor layer, second semiconducting layer, quantum well layer and strain inducing thin film layer at a predetermined annealing temperature, to thereby achieve varied interdiffusion of constituent atoms between each respective quantum well layer section in the quantum well layer and the first and/or second semiconducting layers during annealing, the interdiffusion of each quantum layer well section varying based on the thickness of the thin film layer positioned above the quantum layer well section. The method may further comprise removing the strain inducing thin film layer to leave the quantum well layer sections having the varied interdiffusion, wherein the varied interdiffusion in each of the quantum well layer sections causes each of the quantum well layer sections to lase at a different peak energy when energized.

In this aspect, the quantum well layer may have a substantially uniform epitaxial structure.

In this aspect, the method may further comprise depositing by epitaxial growth, one or more of a cladding layer and/or a waveguide layer between the first semiconductor layer and the quantum well layer.

In this aspect, the method may further comprise depositing by epitaxial growth, one or more of a cladding layer and/or a waveguide layer between the quantum well layer and the second semiconducting layer.

In this aspect, the first type of semiconducting material may be an n-type material, and the second type of semiconducting material may be a p-type material, or the first type of semiconducting material may be a p-type material, and the second type of semiconducting material may be an n-type material.

In another aspect, a method for use in manufacturing a laser diode emitter is provided comprising forming a substrate, forming a first semiconducting layer of semiconducting material of a first type directly or indirectly on the substrate, depositing a first quantum well layer directly or indirectly on the first semiconducting layer by epitaxial growth, under first epitaxial growth conditions to achieve a first epitaxial structure in the first quantum well layer. The method may further comprise depositing a first intervening layer directly or indirectly on the first quantum well layer by epitaxial growth, depositing a second quantum well layer directly or indirectly on the first separating layer by epitaxial growth under second epitaxial growth conditions to achieve a second epitaxial structure in the second quantum well layer. The method may further comprise forming a second semiconducting layer of a second type of semiconducting material directly or indirectly on the second quantum well layer, wherein both the first quantum well layer and the second quantum well layer include $In_xGa_{1-x}N$ or both the first quantum well layer and second quantum well layer include $In_x[Al_yGa_{1-y}]_{1-x}P$.

In this aspect, growth of each of the first quantum well layer and the second quantum well layer may be varied by altering epitaxial growth conditions of the respective first and second quantum well layers to thereby cause each of the first and second quantum well layers to lase at a different peak energy when energized.

In this aspect, the first epitaxial structure and the second epitaxial structure may be varied by changing a growth temperature of $In_xGa_{1-x}N$ at which each of the first and second quantum well layers is grown.

In this aspect, the first epitaxial structure and the second epitaxial structure may be varied by changing a growth temperature of $In_x[Al_yGa_{1-y}]_{1-x}P$ at which each of the first and second quantum well layers is grown.

In this aspect, the first epitaxial structure and the second epitaxial structure may be varied by changing an indium flow rate during the epitaxial growth of the first quantum well layer and the second quantum well layer.

It will be understood that the configurations and/or approaches described herein are exemplary in nature, and that these specific embodiments or examples are not to be considered in a limiting sense, because numerous variations are possible. The specific routines or methods described herein may represent one or more of any number of processing strategies. As such, various acts illustrated and/or described may be performed in the sequence illustrated and/or described, in other sequences, in parallel, or omitted. Likewise, the order of the above-described processes may be changed.

The subject matter of the present disclosure includes all novel and non-obvious combinations and sub-combinations of the various processes, systems and configurations, and other features, functions, acts, and/or properties disclosed herein, as well as any and all equivalents thereof.

The invention claimed is:

1. A laser diode emitter for use in a micro electro-mechanical system (MEMS) laser scanning display device, the laser diode emitter comprising:
 a gain section coupled with a first current or voltage source via a first electrode; and
 a tunable absorber section coupled with a second current or voltage source via a second electrode, wherein:
  at least a portion of the gain section is electrically isolated from at least a portion of the tunable absorber section by a notch separating the first electrode and the second electrode; and
  the notch extends into the laser diode emitter in a vertical direction;
 wherein the second current or voltage source is configured to modify an absorption spectrum of the tunable absorber section by supplying a drive current or voltage that sweeps through a range of values over a period of time to cause a shifting of a wavelength of the laser diode emitter at which an overall gain is at maximum, to thereby cause the laser diode emitter to emit spectrally broadened light.

2. The laser diode emitter of claim 1, wherein the second current or voltage source is configured to sweep through the range of values over a period of time between 2 nanoseconds and 20 nanoseconds.

3. The laser diode emitter of claim 1, wherein an absorption edge inside the tunable absorber section is shifted by 1 nanometer to 20 nanometers over the range of values supplied by the second current or voltage source.

4. The laser diode emitter of claim 1, wherein at least a quantum well layer extends through each of the gain section and the tunable absorber section.

5. The laser diode emitter of claim 1, wherein the gain section is configured to have a flattened gain spectrum.

6. A method comprising:
supplying, via a first current or voltage source, a first drive current or voltage to a gain section coupled with the first current or voltage source by a first electrode;
supplying, via a second current or voltage source, a second drive current or voltage to a tunable absorber section coupled with the second current or voltage source by a second electrode, wherein:
the gain section and the tunable absorber section are included in a laser diode emitter for user in a micro electro-mechanical system (MEMS) laser scanning display device;
at least a portion of the gain section is electrically isolated from at least a portion of the tunable absorber section by a notch separating the first electrode and the second electrode; and
the notch extends into the laser diode emitter in a vertical direction; and
modifying an absorption spectrum of the tunable absorber section by modulating the second drive current or voltage to sweep through a range of values over a period of time to cause a shifting of a wavelength of the laser diode emitter at which an overall gain is at maximum, to thereby cause the laser diode emitter to emit spectrally broadened light.

7. The method of claim 6, wherein the second current or voltage source is configured to sweep through the range of values over a period of time between 2 nanoseconds and 20 nanoseconds.

8. The method of claim 6, wherein an absorption edge inside the tunable absorber section is shifted by up to 20 nanometers over the range of values supplied by the second current or voltage source.

9. The method of claim 6, wherein at least a quantum well layer extends through each of the gain section and the tunable absorber section.

10. The method of claim 6, wherein the gain section is configured to have a flattened gain spectrum achieved by a structure selected from the group consisting of different vicinal angles along a waveguide of the laser diode emitter, quantum well intermixing in the quantum well layer along the waveguide, quantum well sections with different composition, thickness, and/or strain in the quantum well layer, and a patterned substrate prior to epitaxial growth along the waveguide of the laser diode emitter.

\* \* \* \* \*